United States Patent
Hayashi et al.

(10) Patent No.: US 12,264,275 B2
(45) Date of Patent: Apr. 1, 2025

(54) TREATMENT LIQUID

(71) Applicant: FUJIFILM Corporation, Tokyo (JP)

(72) Inventors: Kohei Hayashi, Haibara-gun (JP); Tomonori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 273 days.

(21) Appl. No.: 17/893,303

(22) Filed: Aug. 23, 2022

(65) Prior Publication Data

US 2023/0101156 A1  Mar. 30, 2023

(30) Foreign Application Priority Data

Sep. 2, 2021 (JP) .................. 2021-143129

(51) Int. Cl.

| | |
|---|---|
| *C09K 13/06* | (2006.01) |
| *C09K 13/08* | (2006.01) |
| *C11D 1/65* | (2006.01) |
| *C11D 1/00* | (2006.01) |
| *C11D 1/62* | (2006.01) |
| *C11D 3/04* | (2006.01) |
| *C11D 3/39* | (2006.01) |
| *H01L 21/02* | (2006.01) |

(52) U.S. Cl.
CPC .............. *C09K 13/06* (2013.01); *C09K 13/08* (2013.01); *C11D 1/65* (2013.01); *C11D 1/008* (2013.01); *C11D 1/62* (2013.01); *C11D 3/042* (2013.01); *C11D 3/3942* (2013.01); *C11D 2111/22* (2024.01); *H01L 21/02057* (2013.01)

(58) Field of Classification Search
CPC .......... C09K 13/06; C09K 13/08; C11D 1/65; C11D 1/008; C11D 1/62; C11D 3/042; C11D 3/3942; C11D 2111/22; H01L 21/02057; H01L 21/0206; H01L 21/02074; H01L 21/31144; H01L 21/32134
USPC ................................. 252/79.1–79.4
See application file for complete search history.

(56) References Cited

U.S. PATENT DOCUMENTS

| | | | |
|---|---|---|---|
| 10,392,560 B2 | 8/2019 | Barnes et al. | |
| 2016/0185595 A1* | 6/2016 | Chen ............... | G03F 7/405 |
| | | | 252/79.3 |
| 2020/0255770 A1* | 8/2020 | Das ................. | C11D 3/221 |

OTHER PUBLICATIONS

Millipore, Hexadecylpyridinium chloride monohydrate (Year: 2024).*
Wikipedia, sodium polyacrylate (Year: 2003).*
Wikipedia, polystyrene sulfonate (Year: 2019).*
Wikipedia, polyacrylic acid (Year: 2018).*
Wikipedia, Cetylpyridinium chloride (Year: 1996).*
Millipore Sigma, Hexadecyltrimethylammonium hydroxide solution (Year: 2024).*
Millipore Sigma, Dodecyltrimethylammonium chloride (Year: 2024).*
NIH, Cetylpyridinium Chloride (Year: 2004).*

* cited by examiner

*Primary Examiner* — Duy Vu N Deo
(74) *Attorney, Agent, or Firm* — Sughrue Mion, PLLC

(57) ABSTRACT

A treatment liquid is a treatment liquid including water; a cationic compound; an anionic compound selected from the group consisting of a resin having a carboxy group or a salt thereof, a resin having a sulfo group or a salt thereof, a resin having a phosphorous acid group or a salt thereof, and a resin having a phosphoric acid group or a salt thereof; and an oxidizing agent, in which the treatment liquid has a pH of 7.0 or less, and the treatment liquid is substantially free of abrasive grains.

18 Claims, No Drawings

TREATMENT LIQUID

CROSS-REFERENCE TO RELATED APPLICATIONS

The present application claims priority under 35 U.S.C. § 119 to Japanese Patent Application No. 2021-143129 filed on Sep. 2, 2021. Each of the above application is hereby expressly incorporated by reference, in its entirety, into the present application.

BACKGROUND OF THE INVENTION

1. Field of the Invention

The present invention relates to a treatment liquid.

2. Description of the Related Art

With the progress of miniaturization of semiconductor products, there is an increasing demand to carry out a step of removing unnecessary metal-containing substances, resists, and the like on a substrate with high efficiency and accuracy in a semiconductor manufacturing process.

For example, U.S. Ser. No. 10/392,560B discloses a composition containing an oxidizing agent, an etchant, a corrosion inhibitor, and a solvent, not dissolving tungsten or the like, and being for selectively removing titanium nitride.

SUMMARY OF THE INVENTION

As a result of examining the composition (treatment liquid) described in U.S. Ser. No. 10/392,560B, the present inventors have found that a ratio of a dissolution rate of titanium nitride (TiN) to a dissolution rate of tungsten (W) is not always sufficient, and the dissolution rate of TiN is not sufficient.

Accordingly, an object of the present invention is to provide a treatment liquid in which the ratio of the dissolution rate of TiN to the dissolution rate of W is large and the dissolution rate of TiN is large.

As a result of extensive studies to achieve the foregoing object, the present inventors have completed the present invention. That is, the present inventors have found that the foregoing object can be achieved by the following configurations.

A treatment liquid including: water; a cationic compound; an anionic compound selected from the group consisting of a resin having a carboxy group or a salt thereof, a resin having a sulfo group or a salt thereof, a resin having a phosphorous acid group or a salt thereof, and a resin having a phosphoric acid group or a salt thereof; and an oxidizing agent, in which the treatment liquid has a pH of 7.0 or less, and the treatment liquid is substantially free of abrasive grains.

The treatment liquid according to [1], in which the cationic compound includes a compound having a nitrogen atom.

The treatment liquid according to [1] or [2], in which the cationic compound includes a compound having a structure selected from the group consisting of structures represented by Formulae (1) to (4) which will be described later.

The treatment liquid according to any one of [1] to [3], in which the cationic compound includes a compound selected from the group consisting of compounds represented by Formulae (A) to (G) and (B-1) which will be described later.

The treatment liquid according to any one of [1] to [3], in which the cationic compound includes a compound having a structure represented by Formula (3-4) which will be described later.

The treatment liquid according to [5], in which the cationic compound includes a compound represented by Formula (H) which will be described later.

The treatment liquid according to any one of [1] to [3], in which the cationic compound contains a resin having a repeating unit selected from the group consisting of repeating units represented by Formulae (I) to (L) which will be described later.

The treatment liquid according to [7], in which the cationic compound contains the resin having a repeating unit represented by Formula (L) which will be described later.

The treatment liquid according to any one of [1] to [8], in which a mass ratio of a content of the cationic compound to a content of the anionic compound is 1 to 100.

The treatment liquid according to any one of [1] to [9], in which the oxidizing agent includes one or more oxidizing agents selected from the group consisting of hydrogen peroxide, nitric acid, cerium nitrate salt, iron nitrate, peracetic acid, periodic acid, periodate, perchloric acid, perchlorate, chloric acid, hypochlorous acid, hypochlorite, persulfuric acid, persulfate, peroxodisulfuric acid, peroxodisulfate, isocyanuric acid, isocyanurate, trichloroisocyanuric acid, and trichloroisocyanurate.

The treatment liquid according to any one of [1] to [10], further including: a fluoride source.

The treatment liquid according to [11], in which the fluoride source includes a compound selected from the group consisting of HF, $H_2SiF_6$, $H_2TiF_6$, $H_2ZrF_6$, $HPF_6$, and $HBF_4$.

The treatment liquid according to any one of [1] to [12], further including: a corrosion inhibitor.

The treatment liquid according to any one of [1] to [13], further including: an organic solvent.

The treatment liquid according to any one of [1] to [14], in which the treatment liquid is used as any of a residue removing liquid after etching, a resist stripping agent, a cleaning liquid after chemical mechanical polishing, or an etchant.

According to an aspect of the present invention, it is possible to provide a treatment liquid in which the ratio of the dissolution rate of TiN to the dissolution rate of W is large and the dissolution rate of TIN is large.

DESCRIPTION OF THE PREFERRED EMBODIMENTS

Hereinafter, the present invention will be described in more detail.

The description of the configuration requirements described below may be made based on the representative embodiments of the present invention, but the present invention is not limited to such embodiments.

Hereinafter, the meaning of each description in the present specification will be expressed.

In the present specification, any numerical range expressed by using "to" means a range including the numerical values before and after the "to" as a lower limit value and an upper limit value, respectively.

In the present specification, in a case where two or more types of a certain component are present, the "content" of the component means a total content of the two or more types of components.

In the present specification, "ppm" means "parts per million ($10^{-6}$)", and "ppb" means "parts per billion ($10^{-9}$)".

Unless otherwise specified, the compound described in the present specification may include an isomer (one of two or more compounds having the same number of atoms but different structures), an optical isomer, and an isotope. In addition, the isomer and the isotope each may contain only one type of isomer or isotope or may contain a plurality of types of isomers or isotopes.

In the present specification, the bonding direction of a divalent group (for example, —COO—) described is not limited unless otherwise specified. For example, in a case where Y is —COO— in a compound represented by the formula "X—Y—Z", the compound may be "X—O—CO—Z" or may be "X—CO—O—Z".

In the present specification, the term "weight-average molecular weight" means a weight-average molecular weight in terms of polyethylene glycol measured by gel permeation chromatography (GPC).

Hereinafter, the present invention will be described in more detail.

Hereinafter, the ratio of the dissolution rate of TiN to the dissolution rate of W is large is also referred to as "is excellent in TiN dissolution selectivity".

Treatment Liquid

The treatment liquid according to the embodiment of the present invention contains water; a cationic compound; an anionic compound selected from the group consisting of a resin having a carboxy group or a salt thereof, a resin having a sulfo group or a salt thereof, a resin having a phosphorous acid group or a salt thereof, and a resin having a phosphoric acid group or a salt thereof; and an oxidizing agent, has a pH of 7.0 or less, and is substantially free of abrasive grains.

The mechanism by which the treatment liquid according to the embodiment of the present invention is excellent in TiN dissolution selectivity and exhibits an increase in dissolution rate of TiN is not always clear, but the present inventors speculate as follows.

It is considered that the treatment liquid according to the embodiment of the present invention has a dissolving ability for TiN in a case where the treatment liquid contains water and an oxidizing agent and has a pH of 7.0 or less.

Further, it is considered that, by including a cationic compound and an anionic compound at the same time, a protective layer made of the two compounds is formed at the interface between W and the treatment liquid to reduce the dissolution rate of W, while the protective layer as described above is not formed at the interface between TiN and the treatment liquid, and therefore the selective dissolution of TiN proceeds. The reason why the protective layer is formed only at the interface between W and the treatment liquid is that W tends to be negatively charged at the interface with the treatment liquid in the presence of an oxidizing agent and water, and therefore the protective layer made of the two compounds is easily formed.

Hereinafter, the treatment liquid according to the embodiment of the present invention will be described.

Components of Treatment Liquid

The treatment liquid according to the embodiment of the present invention contains water, a cationic compound, the above-mentioned anionic compound, and an oxidizing agent.

Hereinafter, each component of the treatment liquid will be described.

Water

The treatment liquid contains water.

The water contained in the treatment liquid is not particularly limited, and is preferably distilled water, deionized water, pure water, or ultrapure water and more preferably pure water or ultrapure water from the viewpoint that it does not affect a treatment target.

The content of water may be the remainder of the components that can be contained in the treatment liquid.

The content of water is preferably 1.0% by mass or more, more preferably 30.0% by mass or more, still more preferably 60.0% by mass or more, and particularly preferably 80.0% by mass or more with respect to the total mass of the treatment liquid. The upper limit of the content of water is preferably 99.99% by mass or less, more preferably 99.9% by mass or less, still more preferably 99.0% by mass or less, and particularly preferably 97.0% by mass or less with respect to the total mass of the treatment liquid.

Cationic Compound

The treatment liquid contains a cationic compound.

The cationic compound is a compound having a group having a cationized structure. In addition, the cationized structure also includes a structure that can be cationized in the treatment liquid. That is, the cationic compound also includes a compound which does not have a group having a cationized structure by an elemental substance thereof, but has a group having a structure that can be cationized in the treatment liquid.

The cationic compound is not particularly limited, but it is preferable to include a compound having a nitrogen atom from the viewpoint that it is more excellent in TiN dissolution selectivity.

The compound containing a nitrogen atom is not particularly limited, and may be a low molecular weight compound or a high molecular weight compound (resin).

Among the compounds containing a nitrogen atom, a compound having a structure represented by each of Formulae (1) to (4) is preferable from the viewpoint that it is more excellent in TiN dissolution selectivity.

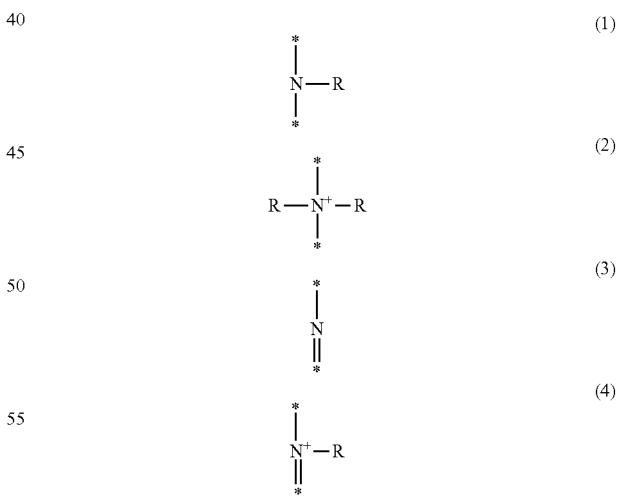

In Formulae (1) to (4), * represents a bonding position.

In Formula (1), Formula (2), and Formula (4), R's each independently represent a hydrogen atom or a monovalent substituent.

Examples of the monovalent substituent represented by R include an alkyl group which may have a substituent, an aryl group which may have a substituent, and a hydroxy group. In addition, the monovalent substituent represented by R may be a monovalent substituent in which the monovalent substituent and a divalent linking group such as —O—, —S—, —NH—, —NRN—, —CO—, —COO—, —CONH—, —SO$_2$—, or —PO$_4$R$_P$— are combined. R$_N$ and R$_P$ each represent a monovalent substituent, examples of which include an alkyl group which may have a substituent.

The alkyl group which may have a substituent may be cyclic or chain-like. The cyclic alkyl group which may have a substituent may be monocyclic or polycyclic. The chain-like alkyl group which may have a substituent may be linear or branched.

The number of carbon atoms in the cyclic alkyl group (cycloalkyl group) which may have a substituent is not particularly limited, and is preferably 4 to 25 and more preferably 5 to 20.

The number of carbon atoms in the chain-like alkyl group which may have a substituent is not particularly limited, and is preferably 1 to 25 and more preferably 1 to 20.

Examples of the substituent in the alkyl group which may have a substituent include a halogen atom, a hydroxy group, an alkyl group which may have a substituent, and an aryl group which may have a substituent. In addition, the methylene group constituting the alkyl group which may have a substituent may be substituted with a divalent linking group such as —O—, —S—, —CO—, —COO—, —CONH—, —SO$_2$—, Formula (1), Formula (2), Formula (3), or Formula (4).

The alkyl group which may have a substituent is preferably a linear alkyl group which does not have a substituent.

The aryl group which may have a substituent may be a heteroaryl group containing an atom other than a carbon atom in the ring member. The aryl group which may have a substituent may be polycyclic or monocyclic. The number of ring-membered atoms in the aryl group which may have a substituent is not particularly limited, and is preferably 5 to 15 and more preferably 5 to 10.

Examples of the substituent in the aryl group which may have a substituent include the same substituent as the substituent in the alkyl group which may have a substituent, among which a halogen atom, a hydroxy group, or an alkyl group having no substituent is preferable.

The group represented by R is preferably a hydrogen atom, an alkyl group which may have a substituent, or an aryl group which may have a substituent.

In addition, in Formulae (1) to (4), the bonding positions represented by * each may be independently bonded to other substituents. That is, it may be a monovalent or divalent group represented by Formula (1-1), Formula (2-1), Formula (3-1), Formula (3-2), Formula (4-1), or Formula (4-2).

(1-1)

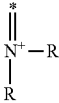

(2-1)

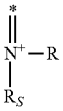

(3-1)

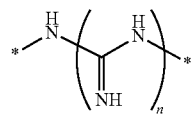

(3-2)

(4-1)

(4-2)

In Formula (1-1), Formula (2-1), Formula (3-2), Formula (4-1), and Formula (4-2), R is the same as R in Formulae (1) to (4).

In Formula (3-1) and Formula (4-2), Rs represents a divalent substituent. Examples of the divalent substituent include a divalent substituent obtained by removing one hydrogen atom from a carbon atom at a bonding position of the alkyl group which may have a substituent.

A compound having a structure represented by Formula (3-3), among the structures represented by the above formulae, is preferable from the viewpoint that it is more excellent in TiN dissolution selectivity.

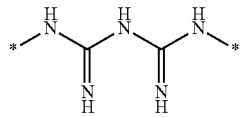

(3-3)

In Formula (3-3), * represents a bonding position.
In Formula (3-3), n represents an integer of 1 to 3.
Above all, an aspect in which n in Formula (3-3) is 2, that is, a compound having a structure represented by Formula (3-4) is more preferable from the viewpoint that it is more excellent in TiN dissolution selectivity.

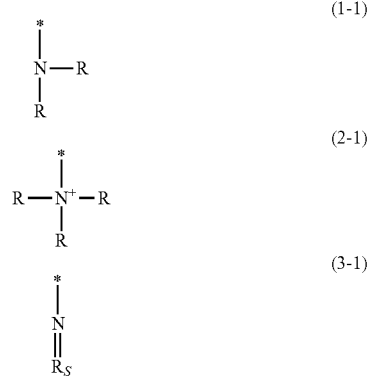

(3-4)

In Formula (3-4), * represents a bonding position.
In addition, another linking group may be bonded to the bonding position in Formulae (1) to (4) to form a ring. The ring formed may or may not have aromaticity as a whole.

Examples of the ring structure having the structure of Formula (1) include a pyrrolidine ring, an imidazolidine ring, a pyrazolidine ring, a piperidine ring, a morpholine ring, a thiazine ring, a pyrrole ring, an indole ring, and a carbazole ring.

Examples of the ring structure having the structure of Formula (2) include those in which the nitrogen atom in the ring structure having the structure of Formula (1) is cationized.

Examples of the ring structure having the structure of Formula (3) include an imidazole ring, a pyrazole ring, an oxazole ring, a thiazole ring, an imidazoline ring, a triazole ring, a tetrazole ring, a pyridine ring, a pyrimidine ring, a pyrazine ring, a benzimidazole ring, a benzotriazole ring, a quinoline ring, a quinazoline ring, a quinoxaline ring, a purine ring, a pteridine ring, and an acridine ring.

Examples of the ring structure having the structure of Formula (4) include those in which the nitrogen atom in the ring structure having the structure of Formula (3) is cationized.

Examples of the compound having the structure of Formula (1) include compounds such as ammonia, a primary amine, a secondary amine, a tertiary amine, a hydroxyamine, and a hydrazine-based compound, and compounds having a ring structure having the structure of Formula (1).

Examples of the compound having the structure of Formula (2) include compounds such as an ammonium salt and a quaternary ammonium salt, and compounds having a ring structure having the structure of Formula (2).

Examples of the compound having the structure of Formula (3) include compounds such as imine, amidine, guanidine, biguanide, triguanide, and oxime, and compounds having a ring structure having the structure of Formula (3).

Examples of the compound having the structure of Formula (4) include compounds such as an iminium salt, an aminidium salt, a guanidinium salt, a biguanide salt, and a tribiguanide salt, and compounds having a ring structure having the structure of Formula (4).

The compound having the structure of each of Formulae (1) to (4) may be a resin containing a repeating unit having the above structure. In addition, the above compound may be in the form of a salt bonded to an appropriate anion.

Hereinafter, the compound having the structure of each of Formulae (1) to (4) will be described.

The compound having the above structure is preferably a compound represented by each of Formulae (A) to (G) and (B-1) from the viewpoint that it is more excellent in TiN dissolution selectivity. Hereinafter, the compound represented by each formula will be described in detail.

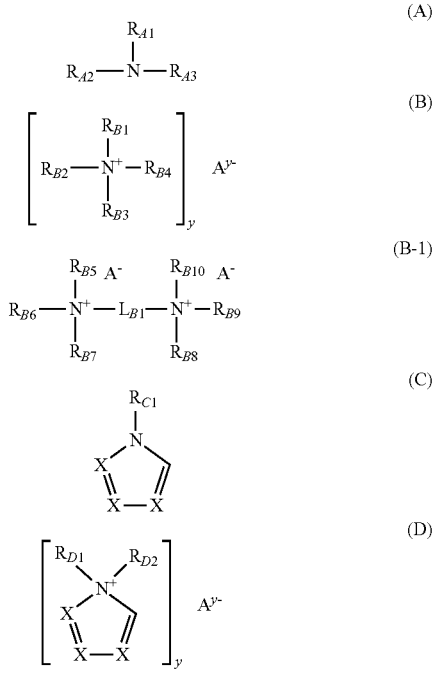

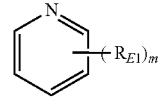

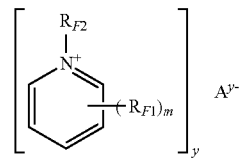

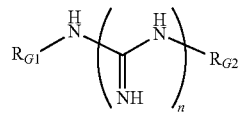

In Formula (A), $R_{A1}$ to $R_{A3}$ each independently represent a hydrogen atom or a monovalent substituent.

Examples of the monovalent substituent represented by each of $R_{A1}$ to $R_{A3}$ include the same groups as R above, among which an alkyl group which may have a substituent or an aryl group which may have a substituent is preferable, an alkyl group which may have a substituent is more preferable, and an alkyl group which does not have a substituent is still more preferable. The alkyl group which does not have a substituent is preferably a linear alkyl group. The number of carbon atoms in the alkyl group which does not have a substituent is not particularly limited, and is preferably 1 to 25 and more preferably 1 to 20.

In addition, an aspect in which among the groups represented by $R_{A1}$ to $R_{A3}$, one group is a linear alkyl group having 3 or less carbon atoms and having no substituent, and the other two groups are linear alkyl groups having 8 or more carbon atoms and having no substituents is also preferable.

Two or more of the monovalent substituents represented by $R_{A1}$ to $R_{A3}$ may be bonded to each other to form a ring.

It is also preferable that the monovalent substituent represented by $R_{A3}$ is a group represented by $-L_{A1}-N(-R_{A1})(-R_{A2})$. In the formula, $L_{A1}$ represents a divalent linking group, examples of which include the same divalent linking group as the divalent linking group represented by $L_{H1}$ which will be described later, among which an alkylene group is preferable. The alkylene group preferably has 1 to 10 carbon atoms.

In Formula (B), $R_{B1}$ to $R_{B4}$ each independently represent a hydrogen atom or a monovalent substituent.

Examples of the monovalent substituent represented by $R_{B1}$ to $R_{B4}$ include the same groups as those mentioned in the monovalent substituent represented by $R_{A1}$ to $R_{A3}$. The same aspect as that of the monovalent substituent represented by $R_{A1}$ to $R_{A3}$ is preferable.

In addition, an aspect in which among the groups represented by $R_{B1}$ to $R_{B4}$, one group is a linear alkyl group having 8 or more carbon atoms and having no substituent, and the other three groups are linear alkyl groups having 3 or less carbon atoms and having no substituents is also preferable.

Two or more of the monovalent substituents represented by $R_{B1}$ to $R_{B4}$ may be bonded to each other to form a ring.

In Formula (B), $A^{y-}$ represents a y-valent anion. In addition, in Formula (B), y represents an integer of 1 to 6. Therefore, Formula (B) represents a compound in which a y-valent anion $A^{y-}$ and y number of cations represented in square brackets are ionically bonded. y is preferably 1 to 4, more preferably 1 to 3, and still more preferably 1 or 2.

The anion is not particularly limited and may be an inorganic ion or an organic ion, among which an inorganic ion is preferable. Examples of the inorganic ion include a chloride ion, a bromide ion, an iodide ion, and a sulfate ion.

Above all, the anion is preferably a chloride ion, a bromide ion, or an iodide ion.

In Formula (B-1), $R_{B4}$ to $R_{B10}$ each independently represent a hydrogen atom or a monovalent substituent. Examples of the monovalent substituent represented by $R_{B4}$ to $R_{B10}$ include the same groups as those mentioned in the monovalent substituent represented by $R_{A1}$ to $R_{A3}$. The same aspect as that of the monovalent substituent represented by $R_{A1}$ to $R_{A3}$ is preferable.

In Formula (B-1), $L_{B1}$ represents a divalent linking group. Examples of the divalent linking group represented by $L_{B1}$ include the same divalent linking group as the divalent linking group represented by $L_{H1}$ which will be described later, among which an alkylene group is preferable. The alkylene group preferably has 1 to 10 carbon atoms.

In Formula (B-1), $A^-$ represents a monovalent anion. The anion is not particularly limited, and may be, for example, the monovalent ion represented by $A^{y-}$. Above all, the anion is preferably a chloride ion, a bromide ion, or an iodide ion.

In Formula (C), $R_{C1}$ represents a hydrogen atom or a monovalent substituent.

Examples of the monovalent substituent represented by $R_{C1}$ include the same groups as those mentioned in the monovalent substituent represented by $R_{A1}$ to $R_{A3}$. The same aspect as that of the monovalent substituent represented by $R_{A1}$ to $R_{A3}$ is preferable. In addition, it is preferable that $R_{C1}$ represents a hydrogen atom.

In Formula (C), X's each independently represent a nitrogen atom or CH.

Of the X's in Formula (C), one or two X's are preferably N.

In Formula (D), $R_{D1}$ and $R_{D2}$ represent a hydrogen atom or a monovalent substituent.

Examples of the monovalent substituent represented by $R_{D1}$ and $R_{D2}$ include the same groups as those mentioned in the monovalent substituent represented by $R_{A1}$ to $R_{A3}$. The same aspect as that of the monovalent substituent represented by $R_{A1}$ to $R_{A3}$ is preferable.

In Formula (D), X's each independently represent a nitrogen atom or CH.

Of the X's in Formula (D), one or two X's are preferably N.

In Formula (D), $A^{y-}$ represents a y-valent anion. In Formula (D), y represents an integer of 1 to 6.

Since y and anion are the same as those described in Formula (B), the description thereof will be omitted.

In Formula (E), $R_{E1}$ represents a monovalent substituent.

Examples of the monovalent substituent represented by $R_{E1}$ include the same groups as R above, among which an alkyl group which may have a substituent, a hydroxy group, or a halogen atom is preferable. The alkyl group which may have a substituent is as described above.

In Formula (E), m represents an integer of 0 to 5.

m is preferably 0 to 3, more preferably 0 or 1, and still more preferably 0.

In Formula (F), $R_{F1}$ represents a monovalent substituent.

Examples of the monovalent substituent represented by $R_{F1}$ include the same groups as those mentioned in the monovalent substituent represented by $R_{E1}$. The same aspect as that of the monovalent substituent represented by $R_{E1}$ is preferable.

In Formula (F), $R_{F2}$ represents a hydrogen atom or a monovalent substituent.

Examples of the monovalent substituent represented by $R_{F2}$ include the same groups as those mentioned in the monovalent substituent represented by $R_{A1}$ to $R_{A3}$. The same aspect as that of the monovalent substituent represented by $R_{A1}$ to $R_{A3}$ is preferable. Above all, an aspect in which the monovalent substituent represented by $R_{F2}$ is a linear alkyl group having 8 to 20 carbon atoms is preferable.

In Formula (F), m represents an integer of 0 to 5.

m is preferably 0 to 3, more preferably 0 or 1, and still more preferably 0.

In Formula (F), $A^{y-}$ represents a y-valent anion. In Formula (F), y represents an integer of 1 to 6.

Since y and anion are the same as those described in Formula (B), the description thereof will be omitted.

In Formula (G), $R_{G1}$ and $R_{G2}$ each independently represent a hydrogen atom or a monovalent substituent.

Examples of the monovalent substituent represented by $R_{G1}$ and $R_{G2}$ include the same groups as R above, among which an alkyl group which may have a substituent or an aryl group which may have a substituent is preferable. The number of carbon atoms in the alkyl group which may have a substituent is preferably 1 to 8, and it is also preferable that the alkyl group has a hydroxy group as the substituent. The aryl group which may have a substituent is preferably a phenyl group which may have a substituent, and it is also preferable that the aryl group has an alkyl group having 1 to 3 carbon atoms as the substituent. In addition, it is preferable that either $R_{G1}$ or $R_{G2}$ represents a hydrogen atom.

In Formula (G), n represents an integer of 1 to 3.

n is preferably 2 or 3 and more preferably 2 from the viewpoint that it is more excellent in TiN dissolution selectivity.

The compound represented by Formula (G) is preferably a compound represented by Formula (H) from the viewpoint that it is more excellent in TiN dissolution selectivity.

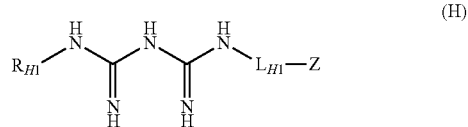

In Formula (H), $R_{H1}$ represents a hydrogen atom or a monovalent substituent.

Examples of the monovalent substituent represented by $R_{H1}$ include the same groups as those mentioned in the monovalent substituent represented by $R_{G1}$ and $R_{G2}$. The same aspect as that of the monovalent substituent represented by $R_{G1}$ and $R_{G2}$ is preferable. In addition, it is preferable that $R_{H1}$ represents a hydrogen atom.

In Formula (H), $L_{H1}$ represents a single bond or a divalent linking group.

Examples of the divalent linking group represented by $L_{H1}$ include an alkylene group, a cycloalkylene group, an arylene group, and a group in which one or more divalent linking groups selected from the group consisting of —O—, —S—, —CO—, —COO—, —CONH—, and —SO$_2$— are combined with an alkylene group, a cycloalkylene group, and an arylene group.

Among those groups, an alkylene group is preferable as the divalent linking group represented by $L_{H1}$. The number of carbon atoms in the alkylene group is not particularly limited, and is preferably 1 to 15 and more preferably 3 to 10.

In Formula (H), Z represents an alkyl group which may have a substituent, an aryl group which may have a substituent, or a group represented by Formula (3-5). Above all, a group represented by Formula (3-5) is preferable from the viewpoint that it is more excellent in TiN dissolution selectivity.

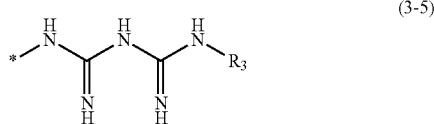

(3-5)

In Formula (3-5), * represents a bonding position.

In Formula (3-5), $R_3$ represents a hydrogen atom or a monovalent substituent.

Examples of the monovalent substituent represented by $R_3$ include the same groups as those mentioned in the monovalent substituent represented by $R_{C1}$ and $R_{G2}$. The same aspect as that of the monovalent substituent represented by $R_{C1}$ and $R_{G2}$ is preferable. Above all, the monovalent substituent represented by $R_3$ is preferably an alkyl group which may have a substituent or an aryl group which may have a substituent, and more preferably an aryl group which may have a substituent. The substituent in the aryl group which may have a substituent is preferably an alkyl group having 1 to 3 carbon atoms, a hydroxy group, or a halogen atom and more preferably a halogen atom.

Specific examples of the cationic compound include tributylamine, didodecylmethylamine, hexadecyltrimethyl-ammonium chloride, cetylpyridinium chloride, hexamethonium chloride dihydrate, guanidinoacetic acid, 4-guanidinobutyric acid, 3-methyl-L-arginine, arginine, homoarginine, $N^5$-monomethyl-L-arginine, canavanine, $N^2$-methyl-L-arginine, $N^2$-(2-aminoethyl)-D-arginine, $N^2$-(2-aminoethyl)-L-arginine, 2-methyl-L-arginine, 1-phenylbiguanide, 1-(o-tolyl)biguanide, 1-(3-methylphenyl)biguanide, 1-(4-methylphenyl)biguanide, 1-(2-chlorophenyl)biguanide, 1-(4-chlorophenyl)biguanide, 1-(2,3-dimethylphenyl)biguanide, 1-(2,6-dimethylphenyl)biguanide, 1-(1-naphthyl)biguanide, 1-(4-methoxyphenyl)biguanide, 1-(4-nitrophenyl)biguanide, 1-diphenyl biguanide, 1,5-diphenyl biguanide, 1,5-bis(4-chlorophenyl)biguanide, 1,5-bis(3-chlorophenyl)biguanide, 1-(4-chlorophenyl)-5-(4-methoxyphenyl)biguanide, 1,1-bis(3-chloro-4-methoxyphenyl)biguanide, 1,5-bis(3,4-dichlorophenyl)biguanide, 1,5-bis(3,5-dichlorophenyl)biguanide, 1,5-bis(4-bromophenyl)biguanide, 1,1-phenyl-1-methylbiguanide, 1-(4-chlorophenyl)-5-(1-methylethyl)biguanide (also known as proguanil), 1-(3,4-dichlorophenyl)-5-(1-methylethyl)biguanide, 1-(4-methylphenyl)-5-octylbiguanide, 1-(4-chlorophenyl)-2-(N'-propan-2-ylcarbamimidoyl)guanidine, ditolylbiguanide, dinaphthylbiguanide, dibenzylbiguanide, 4-chlorobenzhydrylbiguanide, 1-benzo[1,3]dioxol-5-ylmethylbiguanide, 1-benzyl-5-(pyridin-3-yl)methyl-biguanide, 1-benzylbiguanide, 4-chlorobenzylbiguanide, 1-(2-phenylethyl)biguanide, 1-hexyl-5-benzylbiguanide, 1,1-dibenzylbiguanide, 1,5-dibenzylbiguanide, 1-(phenethyl)-5-propylbiguanide, 1,5-bis(phenetyl)biguanide, 1-cyclohexyl-5-phenylbiguanide, 1-(4-phenylcyclohexyl)biguanide, 1-(4-methyl)cyclohexyl-5-phenylbiguanide, 1-cyclopentyl-5-(4-methoxyphenyl)biguanide, norbornyl-biguanide, dinorbornylbiguanide, adamantylbiguanide, diadamantylbiguanide, dicyclohexylbiguanide, ethylene dibiguanide, propylene dibiguanide, tetramethylene dibiguanide, pentamethylene dibiguanide, hexamethylene dibiguanide, heptamethylene dibiguanide, octamethylene dibiguanide, 1,6-bis-(4-chlorobenzylbiguanide)-hexane, 1,1'-hexamethylenebis(5-(p-chlorophenyl)biguanide) (also known as chlorhexidine), 2-(benzyloxymethyl)pentane-1,5-bis(5-hexylbiguanide), 2-(phenylthiomethyl)pentane-1,5-bis(5-phenethylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), 3-(benzylthio)hexane-1,6-bis(5-cyclohexylbiguanide), phenylenyldibiguanide, naphthylenyldibiguanide, pyridinyldibiguanide, piperazinyldibiguanide, phthalyldibiguanide, 1,1'-[4-(dodecyloxy)-m-phenylene]bisbiguanide, 2-(decylthiomethyl)pentane-1,5-bis(5-isopropylbiguanide), 2-(decylthiomethyl)pentane-1,5-bis(5,5-diethylbiguanide), 1,1-dimethylbiguanide (also known as metformin), 1-(2-phenylethyl)biguanide (also known as phenformin), and polyalkylene biguanide (for example, polyhexamethylene biguanide).

Hereinafter, the resin containing a repeating unit having the structure of each of Formulae (1) to (4) will be described. The repeating unit is preferably a repeating unit represented by each of Formulae (I) to (L). Hereinafter, the repeating unit represented by each formula will be described in detail.

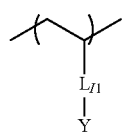

(I)

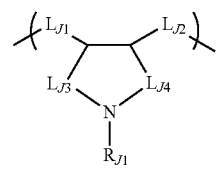

(J)

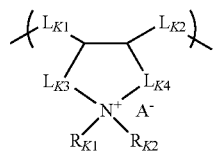

(K)

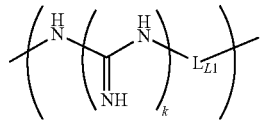

(L)

In Formula (I), Ln represents a single bond or a divalent linking group.

Examples of the divalent linking group represented by Ln include the divalent linking group represented by $L_{H1}$, among which an alkylene group or an arylene group is preferable, and an alkylene group is more preferable. The number of carbon atoms in the alkylene group is not particularly limited, and is preferably 1 to 6 and more preferably 1 to 4. The number of carbon atoms in the arylene group is not particularly limited, and is preferably 6 to 10.

In Formula (I), Y represents a group having a structure represented by Formula (1-1), Formula (2-1), Formula (3-1), or Formula (4-2). Y is preferably a group having a structure represented by Formula (1-1) or Formula (2-1) and more preferably a group having a structure represented by Formula (1-1).

In Formula (J), $L_{J1}$ to $L_{J4}$ each independently represent a single bond or a divalent linking group.

Examples of the divalent linking group represented by $L_1$ and $L_2$ include the divalent linking group represented by $L_{H1}$, among which an alkylene group is preferable. The number of carbon atoms in the alkylene group is not particularly limited, and is preferably 1 to 6 and more preferably 1 to 4.

Examples of the divalent linking group represented by $L_{J1}$ and $L_{J2}$ include the divalent linking group represented by $L_{H1}$, among which an alkylene group is preferable. The number of carbon atoms in the alkylene group is not particularly limited, and is preferably 1 to 3 and more preferably 1 or 2.

In Formula (J), $R_{J1}$ represents a hydrogen atom or a monovalent substituent.

Examples of the monovalent substituent represented by $R_{J1}$ include the same groups as those mentioned in the monovalent substituent represented by $R_{A1}$ to $R_{A3}$. The same aspect as that of the monovalent substituent represented by $R_{A1}$ to $R_{A3}$ is preferable. In addition, it is preferable that $R_{J1}$ represents a hydrogen atom.

In Formula (K), $L_{K1}$ to $L_{K4}$ each independently represent a single bond or a divalent linking group.

Since the divalent linking group represented by each of $L_{K1}$ to $L_{K4}$ has the same aspect as that of the corresponding divalent linking group represented by each of $L_1$ to $L_4$, the description thereof will be omitted.

In Formula (K), $R_{K1}$ and $R_{K2}$ each independently represent a hydrogen atom or a monovalent substituent.

Examples of the monovalent substituent represented by $R_{K1}$ and $R_{K2}$ include the same groups as those mentioned in the monovalent substituent represented by $R_{A1}$ to $R_{A3}$. The same aspect as that of the monovalent substituent represented by $R_{A1}$ to $R_{A3}$ is preferable.

In Formula (K), $A^-$ represents a monovalent anion.

The monovalent anion represented by $A^-$ is a monovalent anion, examples of which include the monovalent anion among those described in Formula (B). Above all, the monovalent anion represented by $A^-$ is preferably a chloride ion, a bromide ion, or an iodide ion.

In Formula (L), $L_{H1}$ represents a single bond or a divalent linking group.

Examples of the divalent linking group represented by $L_{H1}$ include the divalent linking group represented by $L_{H1}$, among which an alkylene group or an arylene group is preferable, and an alkylene group is more preferable. The number of carbon atoms in the alkylene group is not particularly limited, and is preferably 1 to 15 and more preferably 4 to 10. The number of carbon atoms in the arylene group is not particularly limited, and is preferably 6 to 10.

In Formula (L), k represents an integer of 0 to 3.

k is preferably 1 or 2 and more preferably 2.

Specific examples of the resins having the repeating units represented by Formulae (I) to (L) include a polymerization product of allylamine, a polymerization product of diallylamine, a polymerization product of diallylalkylamine (for example, a polymerization product of diallylmethylamine), a polymerization product of diallyldialkylammonium salt (for example, a polymerization product of diallyldimethylammonium chloride), and a polymerization product of biguanidyl-substituted α-olefin monomer (for example, poly(vinylbiguanide), poly(N-vinylbiguanide), or poly(allylbiguanide)), as well as copolymers of the compounds before polymerization.

In addition, the resins described in paragraphs [0036] to [0071] of JP1999-255841A (JP-H11-255841A), paragraphs [0025] to [0039] of JP2001-106714A, paragraphs [0062] to [0065] of JP2004-115675A, paragraphs [0051] to [0055] of JP2005-0021% A, paragraphs [0097] to [0111] of JP2005-097636A, paragraphs [0026] to [0027] of JP2015-166463A, paragraphs [0037] to [0048] of JP2017-75243A, paragraphs [0062] to [0069] of JP2021-021020A, and the like are also preferably mentioned as the resins having the repeating units represented by Formulae (I) to (K).

In the resins containing the repeating units represented by Formulae (I) to (L), the mass ratio of one or more repeating units selected from the group consisting of the repeating units represented by Formulae (I) to (L) is preferably 30% to 100% by mass, more preferably 50% to 100% by mass, and still more preferably 70% to 100% by mass with respect to the total mass of the resin. In the above resins, a known repeating unit can be appropriately selected as the repeating unit other than the repeating units represented by Formulae (I) to (L).

The weight-average molecular weight of the resins containing the repeating units represented by Formulae (I) to (L) is preferably 500 to 200,000, more preferably 1,600 to 15,000, and still more preferably 3,000 to 8,000.

The content of the cationic compound is preferably 0.001% by mass or more, more preferably 0.01% by mass or more, and still more preferably 0.03% by mass or more with respect to the total mass of the treatment liquid. The upper limit of the content of the cationic compound is preferably 5.00% by mass or less, more preferably 1.00% by mass or less, still more preferably 0.50% by mass or less, and particularly preferably 0.10% by mass or less with respect to the total mass of the treatment liquid.

The content of the cationic compound is preferably 0.001% by mass or more, more preferably 0.01% by mass or more, and still more preferably 0.03% by mass or more with respect to the total mass of the solid content of the treatment liquid excluding the solvent. The upper limit of the content of the cationic compound is preferably 5.00% by mass or less, more preferably 1.00% by mass or less, still more preferably 0.50% by mass or less, and particularly preferably 0.10% by mass or less with respect to the total mass of the treatment liquid.

One type of cationic compound may be used alone, or two or more types of cationic compounds may be used.

In a case where two or more types of cationic compounds are used, the total amount thereof is preferably in the range of the above-mentioned preferable content.

Anionic Compound

The treatment liquid according to the embodiment of the present invention contains an anionic compound.

The anionic compound is a compound selected from the group consisting of a resin having a carboxy group or a salt thereof, a resin having a sulfo group or a salt thereof, a resin having a phosphorous acid group or a salt thereof, and a resin having a phosphoric acid group or a salt thereof.

The phosphoric acid group refers to a group represented by $-PO_4H_2$, and the phosphorous acid group refers to a group represented by $-PO_3H_2$.

The anionic compound may be any resin having the above group or the salt thereof, and may be a resin having two or more types of the above groups or the salts thereof. For example, the anionic compound may be a resin (copolymer) having a carboxy group and a sulfo group.

The anionic compound is preferably a resin having a repeating unit represented by Formula (1A).

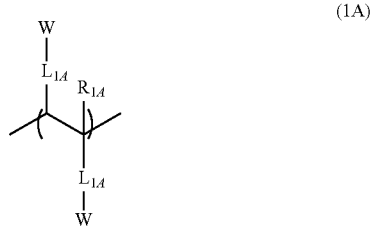

In Formula (1A), $L_{1A}$'s each independently represent a single bond or a divalent linking group.

Examples of the divalent linking group represented by LIA include the divalent linking group represented by $L_{H1}$. Above all, the divalent linking group represented by $L_{1A}$ is preferably an alkylene group, an arylene group, a group consisting of a combination of —COO— and an alkylene group, or a group consisting of a combination of —CONH— and an alkylene group, and more preferably an arylene group or a group consisting of a combination of —CONH— and an alkylene group.

In Formula (1A), $R_{1A}$ represents a hydrogen atom or a monovalent substituent. The monovalent substituent represented by $R_{1A}$ is preferably an alkyl group having 1 to 3 carbon atoms.

In Formula (1A), W's each independently represent a hydrogen atom or an anionic group.

The anionic group represented by W is one of —COOH, —COO$^-$Ct$^+$, —SO$_3$H, —SO$_3{}^{31}$ Ct$^+$, —PO$_4$H$_2$, —PO$_3$H$_2$, —PO$_4{}^{2-}$(Ct$^+$)$_2$, and —PO$_3{}^{2-}$(Ct$^+$)$_2$. Of these, —COOH, —COO$^-$Ct$^+$, —SO$_3$H, or —PO$_3$H$_2$ is preferable.

It should be noted that Ct$^+$ represents a monovalent cation. Ct$^+$ is preferably Na$^+$ or K$^+$.

Examples of the repeating unit represented by Formula (1A) include repeating units derived from acrylic acid, methacrylic acid, maleic acid, 4-vinylbenzoic acid, p-styrenesulfonic acid, vinyl phosphite, vinyl phosphate, 2-(acryloylamino)-2-methyl-1-propanesulfonic acid, and Na salts of these compounds.

The content of the repeating unit represented by Formula (1A) is preferably 50% to 100% by mass, more preferably 70% to 100% by mass, and still more preferably 90% to 100% by mass with respect to the total mass of the anionic compound. A known repeating unit can be appropriately selected as the repeating unit other than the repeating unit represented by Formula (1A) contained in the anionic compound.

The anionic compound may contain two or more types of repeating units represented by Formula (1A).

The weight-average molecular weight of the anionic compound is preferably 2,000 or more, more preferably 10,000 or more, still more preferably 50,000 or more, and particularly preferably 100,000 or more. The upper limit of the weight-average molecular weight of the anionic compound is not particularly limited, and may be 1,000,000 or less.

The mass ratio of the content of the cationic compound to the content of the anionic compound is preferably 0.8 to 120.0, more preferably 1.0 to 100.0, still more preferably 2.0 to 50.0, and particularly preferably 3.0 to 20.0, from the viewpoint that it is more excellent in dissolution rate of TiN and/or from the viewpoint that it is more excellent in TiN dissolution selectivity.

Oxidizing Agent

The treatment liquid according to the embodiment of the present invention contains an oxidizing agent.

The oxidizing agent is a compound different from the above-mentioned cationic compound and anionic compound.

The oxidizing agent is not particularly limited as long as it has an oxidizing ability, and it is preferable that the oxidizing agent contains one or more oxidizing agents selected from the group consisting of hydrogen peroxide, nitric acid, cerium nitrate salt, iron nitrate, peracetic acid, periodic acid, periodate, perchloric acid, perchlorate, chloric acid, hypochlorous acid, hypochlorite, persulfuric acid, persulfate, peroxodisulfuric acid, peroxodisulfate, isocyanuric acid, isocyanurate, trichloroisocyanuric acid, and trichloroisocyanurate. The periodic acid includes metaperiodic acid (HIO$_4$) and orthoperiodic acid (H$_5$IO$_6$). In addition, the periodate includes metaperiodate and orthoperiodate.

Above all, from the viewpoint that it is more excellent in dissolution rate of TiN and/or from the viewpoint that it is more excellent in TiN dissolution selectivity, it is more preferable that the oxidizing agent contains one or more oxidizing agents selected from the group consisting of nitric acid, peracetic acid, periodic acid, perchloric acid, peroxodisulfate, and trichloroisocyanuric acid, and it is still more preferable that the oxidizing agent contains one or more oxidizing agents selected from the group consisting of peracetic acid, periodic acid, perchloric acid, peroxodisulfate, and trichloroisocyanuric acid.

The content of the oxidizing agent is preferably 0.0001% to 5.00% by mass, more preferably 0.001% to 1.00% by mass, and still more preferably 0.001% to 0.10% by mass with respect to the total mass of the treatment liquid.

Abrasive Grains

The treatment liquid according to the embodiment of the present invention is substantially free of abrasive grains.

The "abrasive grains" refer to, for example, abrasive fine particles, and correspond to particles such as inorganic solids, which are finally present as particles without being dissolved in the treatment liquid.

The phrase "substantially free of" means, for example, that the content of the abrasive grains is 0.1% by mass or less with respect to the total mass of the treatment liquid. The content of the abrasive grains is preferably 0.01% by mass or less and more preferably 0.001% by mass or less with respect to the total mass of the treatment liquid. The lower limit of the content of the abrasive grains is not particularly limited, and may be, for example, 0.0% by mass or more.

The content of the abrasive grains can be measured in the liquid phase by using a commercially available measuring device in a light scattering type in-liquid particle measuring method using a laser as a light source.

Fluoride Source

The treatment liquid according to the embodiment of the present invention may contain a fluoride source. The dissolution rate of TiN can be increased by including the fluoride source in the treatment liquid.

The fluoride source is a compound different from the above-mentioned cationic compound and anionic compound.

The fluoride source refers to a compound capable of supplying fluoride ions.

The fluoride source is generally a compound containing fluoride ions and cations.

Examples of the fluoride ion include a fluoride ion ($F^-$), a bifluoride ion ($HF_2^-$), and a fluoride-containing ion (for example, $MF_6^{n-}$, M: any atom, n: 1 to 3). Examples of M include B (boron), Al (aluminum), Si (silicon), P (phosphorus), Ti (titanium), Zr (zirconium), Nb (niobium), Sb (antimony), and Ta (tantalum).

Examples of the cation include $H^+$, $Li^+$, $Na^+$, $K^+$, and $NH_4^+$, among which $H^+$ is preferable.

The fluoride source preferably contains a compound selected from the group consisting of HF, $H_2SiF_6$, $H_2TiF_6$, $H_2ZrF_6$, $HPF_6$, and $HBF_4$, among the above-mentioned fluoride sources.

The content of the fluoride source is preferably 0.001% to 5.00% by mass, more preferably 0.005% to 3.00% by mass, and still more preferably 0.10% to 1.00% by mass with respect to the total mass of the treatment liquid.

One type of fluoride source may be used alone, or two or more types of fluoride sources may be used.

In a case where two or more types of fluoride sources are used, the total amount thereof is preferably in the range of the above-mentioned preferable content.

Corrosion Inhibitor

The treatment liquid according to the embodiment of the present invention may contain a corrosion inhibitor. Since the treatment liquid contains a corrosion inhibitor, the treatment liquid can be made more excellent in TiN dissolution selectivity.

The corrosion inhibitor is a compound different from the above-mentioned cationic compound and anionic compound.

The corrosion inhibitor is not particularly limited, and is preferably a compound containing a silicate ion, a polysilicate ion, a phosphate ion, a polyphosphate ion, or a borate ion.

Above all, the corrosion inhibitor is preferably tetramethylammonium silicate, tetraethylammonium silicate, or boric acid.

The content of the corrosion inhibitor is preferably 0.001% to 5.00% by mass, more preferably 0.005% to 3.00% by mass, and still more preferably 0.10% to 1.00% by mass with respect to the total mass of the treatment liquid.

One type of corrosion inhibitor may be used alone, or two or more types of corrosion inhibitors may be used.

In a case where two or more types of corrosion inhibitors are used, the total amount thereof is preferably in the range of the above-mentioned preferable content.

Organic Solvent

The treatment liquid according to the embodiment of the present invention may contain an organic solvent.

The organic solvent is a compound different from the above-mentioned cationic compound and anionic compound.

The organic solvent is preferably miscible with water in any ratio.

Examples of the organic solvent include an alcohol-based solvent, a glycol-based solvent, a glycol ether-based solvent, a ketone-based solvent, an amide-based solvent, and a sulfur-containing solvent.

Examples of the alcohol-based solvent include methanol, ethanol, propanol, isopropyl alcohol, 1-butanol, 2-butanol, isobutyl alcohol, and tert-butyl alcohol.

Examples of the glycol-based solvent include ethylene glycol, propylene glycol, diethylene glycol, dipropylene glycol, triethylene glycol, and tetraethylene glycol.

Examples of the glycol ether-based solvent include glycol monoether.

Examples of the glycol monoether include ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the ketone-based solvent include acetone, methyl ethyl ketone, methyl isobutyl ketone, and cyclohexanone.

Examples of the amide-based solvent include N,N-dimethylformamide, 1-methyl-2-pyrrolidone, 2-pyrrolidinone, 1,3-dimethyl-2-imidazolidinone, formamide, N-methylformamide, acetamide, N-methylacetamide, N,N-dimethylacetamide, N-methylpropanamide, and hexamethylphosphoric triamide.

Examples of the sulfur-containing solvent include dimethyl sulfone, dimethyl sulfoxide, and sulfolane.

The content of the organic solvent is preferably 0.001% to 5.00% by mass, more preferably 0.005% to 3.00% by mass, and still more preferably 0.10% to 1.00% by mass with respect to the total mass of the treatment liquid.

One type of organic solvent may be used alone, or two or more types of organic solvents may be used.

In a case where two or more types of organic solvents are used, the total amount thereof is preferably in the range of the above-mentioned preferable content.

pH Adjuster

The treatment liquid according to the embodiment of the present invention may contain a pH adjuster. The pH of the treatment liquid may be adjusted to a preferable pH range which will be described later by using a pH adjuster.

The pH adjuster is preferably a compound different from the above-mentioned compounds. Examples of the pH adjuster include an acidic compound and a basic compound.

—Acidic Compound—

The acidic compound is an acidic compound that is acidic (having a pH of less than 7.0) in an aqueous solution.

Examples of the acidic compound include an inorganic acid, an organic acid, and salts thereof.

Examples of the inorganic acid include sulfuric acid, hydrochloric acid, and salts thereof.

Examples of the organic acid include carboxylic acid, sulfonic acid, and salts thereof.

Examples of the carboxylic acid include lower (having 1 to 4 carbon atoms) aliphatic monocarboxylic acids such as formic acid, acetic acid, propionic acid, and butyric acid, and salts thereof.

Examples of the sulfonic acid include methanesulfonic acid, benzenesulfonic acid, p-toluenesulfonic acid (tosic acid), and salts thereof.

The content of the acidic compound is preferably 0.1% to 10.0% by mass and more preferably 0.3% to 5.0% by mass with respect to the total mass of the treatment liquid.

—Basic Compound—

The basic compound is a compound that is alkaline (having a pH of more than 7.0) in an aqueous solution.

Examples of the basic compound include an inorganic base and a salt thereof.

Examples of the inorganic base include alkali metal hydroxides such as sodium hydroxide and potassium hydroxide, and alkaline earth metal hydroxides.

The content of the basic compound is preferably 0.1% to 10.0% by mass and more preferably 0.3% to 5.0% by mass with respect to the total mass of the treatment liquid.

Other Additives

The treatment liquid may contain other additives other than the above-mentioned components.

Hereinafter, other additives will be described.

—Polyhydroxy Compound Having Molecular Weight of 500 or More—

The treatment liquid may contain a polyhydroxy compound having a molecular weight of 500 or more.

The polyhydroxy compound is a compound different from the above-mentioned compounds that can be contained in the treatment liquid.

The polyhydroxy compound is an organic compound having two or more (for example, 2 to 200) alcoholic hydroxyl groups in one molecule.

The molecular weight (weight-average molecular weight in a case of having a molecular weight distribution) of the polyhydroxy compound is 500 or more, preferably 500 to 100,000, and more preferably 500 to 3,000.

Examples of the polyhydroxy compound include polyoxyalkylene glycols such as polyethylene glycol, polypropylene glycol, and polyoxyethylene polyoxypropylene glycol; oligosaccharides such as mannotriose, cellotriose, gentianose, raffinose, melezitose, cellotetrose, and stachyose; and polysaccharides such as starch, glycogen, cellulose, chitin, and chitosan, and hydrolyzates thereof.

Cyclodextrin is also preferable as the polyhydroxy compound.

The cyclodextrin means one type of cyclic oligosaccharide having a cyclic structure in which a plurality of D-glucoses are bonded by a glucoside bond. Compounds in which 5 or more (for example, 6 to 8) glucoses are bonded are known.

Examples of the cyclodextrin include α-cyclodextrin, β-cyclodextrin and γ-cyclodextrin, among which γ-cyclodextrin is preferable.

The polyhydroxy compounds may be used alone or in a combination of two or more thereof.

The content of the polyhydroxy compound is preferably 0.01% to 10% by mass, more preferably 0.05% to 5% by mass, and still more preferably 0.1% to 3% by mass with respect to the total mass of the treatment liquid.

The content of the polyhydroxy compound is preferably 0.01% to 30% by mass, more preferably 0.05% to 25% by mass, and still more preferably 0.5% to 20% by mass with respect to the total mass of the components in the treatment liquid excluding the solvent.

Surfactant

The treatment liquid according to the embodiment of the present invention may contain a surfactant.

The polyhydroxy compound is a compound different from the above-mentioned compounds that can be contained in the treatment liquid.

The surfactant is not particularly limited as long as it is a compound having a hydrophilic group and a hydrophobic group (lipophilic group) in one molecule, and examples thereof include a nonionic surfactant.

The hydrophobic group of the surfactant is not particularly limited, and examples thereof include an aliphatic hydrocarbon group, an aromatic hydrocarbon group, and a combination thereof.

In a case where the hydrophobic group contains an aromatic hydrocarbon group, the hydrophobic group preferably has 6 or more carbon atoms and more preferably 10 or more carbon atoms.

In a case where the hydrophobic group does not contain an aromatic hydrocarbon group and is composed only of an aliphatic hydrocarbon group, the hydrophobic group preferably has 8 or more carbon atoms and more preferably 10 or more carbon atoms. The upper limit of the number of carbon atoms in the hydrophobic group is not particularly limited, and is preferably 24 or less and more preferably 20 or less.

The total number of carbon atoms in the surfactant is preferably 16 to 100.

Examples of the nonionic surfactant include an ester type nonionic surfactant, an ether type nonionic surfactant, an ester ether type nonionic surfactant, and an alkanolamine type nonionic surfactant, among which an ether type nonionic surfactant is preferable.

Examples of the nonionic surfactant include polyethylene glycol, alkyl polyglucoside (Triton BG-10 and Triton CG-110 surfactants manufactured by Dow Chemical Company), octylphenol ethoxylate (Triton X-114 manufactured by Dow Chemical Company), silane polyalkylene oxide (copolymer) (Y-17112-SGS sample manufactured by Momentive Performance Materials Inc.), nonylphenol ethoxylate (Tergitol NP-12, and Triton (registered trademark) X-102, X-100, X-45, X-15, BG-10 and CG-119 manufactured by Dow Chemical Company), Silwet (registered trademark) HS-312 (manufactured by Momentive Performance Materials Inc.), tristyrylphenol ethoxylate (MA-KON TSP-20 manufactured by Stepan Company), polyoxyethylene alkyl ether, polyoxyethylene alkylphenyl ether, alkylallyl formaldehyde condensed polyoxyethylene ether, polyoxyethylene polyoxypropylene block polymer, polyoxyethylene polyoxypropylene alkyl ether, polyoxyethylene ether of glycerin ester, polyoxyethylene ether of sorbitan ester, polyoxyethylene ether of sorbitol ester, polyethylene glycol fatty acid ester, glycerin ester, polyglycerin ester, sorbitan ester, propylene glycol ester, sucrose ester, aliphatic acid alkanolamide, polyoxyethylene fatty acid amide, polyoxyethylene alkyl amide, alcohol ethoxylates such as BRIJ (registered trademark) 56 ($C_{16}H_{33}(OCH_2CH_2)_{10}OH$), BRIJ (registered trademark) 58 ($C_{16}H_{33}(OCH_2CH_2)_{20}OH$), and BRIJ (registered trademark) 35 ($C_{12}H_{25}(OCH_2CH_2)_{23}OH$), alcohol (primary and secondary alcohol) ethoxylate, amine ethoxylate, glucoside, glucamide, polyethylene glycol, poly(ethylene glycol-co-propylene glycol), cetyl alcohol, stearyl alcohol, cetostearyl alcohol (cetyl and stearyl alcohol), oleyl alcohol, octaethylene glycol monododecyl ether, pentaethylene glycol monododecyl ether, polyoxypropylene glycol alkyl ether, decyl glucoside, lauryl glucoside, octyl glucoside, polyoxyethylene glycol octylphenol ether, nonoxynol-9, glycerol alkyl ester, glyceryl laurate, polyoxyethylene glycol sorbitan alkyl ester, polysorbate, sorbitan alkyl ester, SPAN, cocamide MEA, cocamide DEA, dodecyldimethylamine oxide, block copolymer of polypropylene glycol, and mixtures thereof.

The content of the surfactant is preferably 0.001% to 8.0% by mass, more preferably 0.005% to 5.0% by mass, and still more preferably 0.01% to 3.0% by mass with respect to the total mass of the treatment liquid.

—Antibacterial Agent—

The treatment liquid may contain an antibacterial agent.

The antibacterial agent is a compound different from the above-mentioned compounds that can be contained in the treatment liquid.

Examples of the antibacterial agent include sorbic acid, benzoic acid, dehydroacetic acid, fosfomycin, penicillin, sulbactam, and diaphenyl sulfone.

Reducing Sulfur Compound

The treatment liquid may contain a reducing sulfur compound.

The reducing sulfur compound is a compound different from the above-mentioned compounds that can be contained in the treatment liquid.

The reducing sulfur compound is a compound having reducing properties and containing a sulfur atom.

The reducing sulfur compound can improve the corrosion prevention effect of the treatment liquid. That is, the reducing sulfur compound can act as a corrosion inhibitor.

Examples of the reducing sulfur compound include mercaptosuccinic acid, dithiodiglycerol, bis(2,3-dihydroxypropylthio)ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Above all, a compound having an SH group (mercapto compound) is preferable, and 1-thioglycerol, sodium 3-mercapto-1-propanesulfonate, 2-mercaptoethanol, 3-mercapto-1-propanol, or thioglycolic acid is more preferable.

The reducing sulfur compounds may be used alone or in a combination of two or more thereof.

The content of the reducing sulfur compound is preferably 0.01% to 10% by mass, more preferably 0.05% to 5% by mass, and still more preferably 0.1% to 3% by mass with respect to the total mass of the treatment liquid.

The content of the reducing sulfur compound is preferably 0.01% to 30.0% by mass, more preferably 0.05% to 25.0% by mass, and still more preferably 0.5% to 20.0% by mass with respect to the total mass of the components in the treatment liquid excluding the solvent.

Physical properties of treatment liquid Hereinafter, the physical properties of the treatment liquid will be described.

pH

The pH of the treatment liquid according to the embodiment of the present invention is 7.0 or less.

Here, the pH of the treatment liquid can be measured by a method based on JIS Z8802-1984 using a known pH meter. The measurement temperature is 25° C.

From the viewpoint that it is more excellent in dissolution rate of TiN and/or from the viewpoint that it is more excellent in TiN dissolution selectivity, the pH of the treatment liquid is preferably 1.0 to 6.5, more preferably 1.5 to 5.5, still more preferably 1.5 to 4.0, and particularly preferably 2.0 to 3.0.

Metal Content

In the treatment liquid according to the embodiment of the present invention, the contents (measured as ion concentrations) of metals (metal elements of Fe, Co, Na, Cu, Mg, Mn, Li, Al, Cr, Ni, Zn, Sn, and Ag) contained as impurities in the liquid are all preferably 5 ppm by mass or less and more preferably 1 ppm by mass or less. In the manufacture of state-of-the-art semiconductor elements, it is expected that a treatment liquid having a higher purity is required, so that the metal content is more preferably a value lower than 1 ppm by mass, that is, ppb by mass order or less, particularly preferably 100 ppb by mass or less, and most preferably less than 10 ppb by mass. The lower limit of the metal content is preferably 0.

As a method for reducing the metal content, for example, a purification treatment such as distillation or filtration using an ion exchange resin or a filter is carried out at the stage of the raw material used in the manufacture of the treatment liquid or the stage after the manufacture of the treatment liquid.

As another method for reducing the metal content, a container with less elution of impurities, which will be described later, may be used as a container for accommodating the raw material or the manufactured treatment liquid. In addition, it is also possible to apply a fluororesin lining to the interior wall of the pipe so that the metal component does not elute from the pipe or the like during the manufacture of the treatment liquid.

Coarse Particles

The treatment liquid may contain coarse particles, but the content thereof is preferably low.

The coarse particles mean particles having a diameter (particle diameter) of 0.03 μm or more in a case where the shape of the particles is regarded as a sphere. The abrasive grains may be included in the coarse particles.

Regarding the content of coarse particles in the treatment liquid, the content of particles having a particle diameter of 0.1 μm or more is preferably 10,000 or less and more preferably 5,000 or less per 1 mL of the treatment liquid. The lower limit of the content of particles having a particle diameter of 0.1 μm or more is preferably 0 or more and more preferably 0.01 or more per 1 mL of the treatment liquid.

The coarse particles contained in the treatment liquid correspond to particles such as dust, dirt, organic solids, and inorganic solids contained as impurities in the raw material, and particles such as dust, dirt, organic solids, and inorganic solids brought in as contaminants during the preparation of the treatment liquid, which are finally present as particles without being dissolved in the treatment liquid.

The content of the coarse particles present in the treatment liquid can be measured in the liquid phase by using a commercially available measuring device in a light scattering type in-liquid particle measuring method using a laser as a light source.

Examples of the method for removing coarse particles include a purification treatment such as filtering which will be described later.

Manufacturing Method of Treatment Liquid

The treatment liquid can be manufactured by a known method. Hereinafter, the manufacturing method of the treatment liquid will be described in detail.

Liquid Preparation Step

With regard to a method for preparing a treatment liquid, for example, the treatment liquid can be manufactured by mixing each of the above-mentioned components.

The order and/or timing of mixing each of the above-mentioned components is not particularly limited. For example, there is a method of preparing a treatment liquid by sequentially adding a cationic compound, an anionic compound, and an oxidizing agent to a container containing purified pure water, stirring and mixing the components, and adding a pH adjuster to adjust the pH of the mixed liquid. In addition, in a case where water and each component are added to the container, the components may be added all at once or may be added in a plurality of divided portions.

With regard to the stirring device and the stirring method used for preparing the treatment liquid, a known device may be used as a stirrer or a disperser. Examples of the stirrer include an industrial mixer, a portable stirrer, a mechanical stirrer, and a magnetic stirrer.

Examples of the disperser include an industrial disperser, a homogenizer, an ultrasonic disperser, and a beads mill.

The mixing of each component in the liquid preparation step of the treatment liquid, the purification treatment which will be described later, and the storage of the manufactured treatment liquid are preferably carried out at 40° C. or lower and more preferably 30° C. or lower.

In addition, the lower limit of the temperature for those operations is preferably 5° C. or higher and more preferably 10° C. or higher. The performance can be stably maintained for a long period of time by preparing, treating and/or storing the treatment liquid in the above temperature range.

Purification Treatment

It is preferable to carry out a purification treatment in advance on any one or more of the raw materials for preparing the treatment liquid. Examples of the purification treatment include known methods such as distillation, ion exchange, and filtering.

With regard to the degree of purification, it is preferable to purify until the purity of the raw material is 99% by mass or more, and it is more preferable to purify until the purity of the stock solution is 99.9% by mass or more.

Examples of the purification treatment method include a method of passing a raw material through an ion exchange resin, a reverse osmosis membrane (RO membrane), or the like, distillation of a raw material, and filtering, which will be described later, of a raw material.

A plurality of the above purification methods may be combined and carried out as the purification treatment. For example, the raw material may be subjected to primary purification of passing the raw material through an RO membrane, and then secondary purification of passing the raw material through a purification device consisting of a cation exchange resin, an anion exchange resin, or a mixed bed type ion exchange resin.

In addition, the purification treatment may be carried out a plurality of times.

Filtering

The filter used for filtering is not particularly limited as long as it is conventionally used for filtering purposes and the like. Examples of the filter include filters consisting of fluororesins such as polytetrafluoroethylene (PTFE) and tetrafluoroethylene perfluoroalkyl vinyl ether copolymer (PFA), polyamide-based resins such as nylon, and polyolefin resins (including high density or ultra high molecular weight resins) such as polyethylene and polypropylene (PP). Among these materials, a material selected from the group consisting of polyethylene, polypropylene (including high density polypropylene), fluororesin (including PTFE and PFA), and polyamide-based resin (including nylon) is preferable. A fluororesin filter is more preferable. By filtering the raw materials using a filter formed of these materials, it is possible to effectively remove highly polar foreign substances that are likely to cause defects.

The critical surface tension of the filter is preferably 70 to 95 mN/m and more preferably 75 to 85 mN/m. The value of the critical surface tension of the filter is a nominal value of the manufacturer. By using a filter having a critical surface tension in the above range, it is possible to effectively remove highly polar foreign substances that are likely to cause defects.

The pore diameter of the filter is preferably 2 to 20 nm and more preferably 2 to 15 nm. By setting the pore diameter of the filter within this range, it is possible to reliably remove fine foreign substances such as impurities and aggregates contained in the raw material while suppressing filtration clogging. With regard to the pore diameter of the filter here, reference can be made to a nominal value of the filter manufacturer.

Filtering may be carried out only once or may be carried out twice or more. In a case where the filtering is carried out twice or more, the filters used may be the same as or different from each other.

In addition, the filtering is preferably carried out at room temperature (25° C.) or lower, more preferably 23° C. or lower, and still more preferably 20° C. or lower. In addition, the filtering temperature is preferably 0° C. or higher, more preferably 5° C. or higher, and still more preferably 10° C. or higher. By filtering in the above temperature range, the amount of particulate foreign substances and impurities dissolved in the raw material can be reduced, and therefore the foreign substances and impurities can be efficiently removed.

Container

The treatment liquid (including an aspect of a diluted treatment liquid which will be described later) can be filled in any container for storage, transportation, and use as long as corrosiveness or the like does not become a problem.

For semiconductor applications, the container is preferably a container having a high degree of cleanliness inside the container and suppressing elution of impurities from the interior wall of the container's housing part into each liquid. Examples of such a container include various containers commercially available as a container for a semiconductor treatment liquid, examples of which include, but are not limited to, "CLEAN BOTTLE" series manufactured by Aicello Chemical Co., Ltd. and "PURE BOTTLE" manufactured by Kodama Plastics Co., Ltd.

In addition, the container for accommodating the treatment liquid is preferably a container in which the liquid contact portion with each liquid such as the interior wall of the housing part is formed of a fluororesin (perfluororesin) or a metal subjected to rust prevention and metal elution prevention treatments.

The interior wall of the container is preferably formed of one or more resins selected from the group consisting of a polyethylene resin, a polypropylene resin and a polyethylene-polypropylene resin, or a different resin or a metal that has been subjected to rust prevention and metal elution prevention treatments such as stainless steel, Hastelloy, Inconel, and Monel.

The different resin is preferably a fluororesin (perfluororesin). In this manner, using a container whose interior wall is a fluororesin makes it possible to suppress the occurrence of a problem of elution of an ethylene or propylene oligomer as compared with a container whose interior wall is a polyethylene resin, a polypropylene resin, or a polyethylene-polypropylene resin.

Examples of the container whose interior wall is a fluororesin include a FluoroPure PFA composite drum manufactured by Entegris, Inc. In addition, the containers described on page 4 of JP1991-502677A (JP-$H_{03}$-502677A), page 3 of WO2004/016526A, pages 9 and 16 of WO99/46309A, and the like can also be used.

In addition, quartz and an electropolished metal material (that is, a metal material subjected to electropolishing) in addition to the fluororesin are also preferably used for the interior wall of the container.

The metal material used in the manufacture of the electropolished metal material is preferably a metal material containing at least one selected from the group consisting of chromium and nickel, in which the total content of chromium and nickel is more than 25% by mass with respect to the total mass of the metal material, examples of which include stainless steel and a nickel-chromium alloy.

The total content of chromium and nickel in the metal material is more preferably 30% by mass or more with respect to the total mass of the metal material.

The upper limit of the total content of chromium and nickel in the metal material is generally preferably 90% by mass or less.

A known method can be used as a method for electropolishing a metal material. For example, the methods described in paragraphs [0011] to [0014] of JP2015-227501A and paragraphs [0036] to [0042] of JP2008-264929A can be used.

It is preferable that the inside of these containers is cleaned before filling with the treatment liquid. A liquid used for cleaning preferably has a reduced amount of metal impurities in the liquid. The treatment liquid may be bottled in a container such as a gallon bottle or a quart bottle after manufacture, transported and stored.

The inside of the container may be purged with an inert gas (such as nitrogen or argon) having a purity of 99.99995% by volume or more for the purpose of preventing changes in the components in the treatment liquid during storage. In particular, a gas having a low moisture content is preferable. In addition, during transportation and storage, the temperature may be normal temperature, and the temperature may be controlled in a range of −20° C. to 20° C. in order to prevent deterioration.

Clean Room

It is preferable that the handling including manufacturing of the treatment liquid, opening and cleaning of the container, filling of the treatment liquid, and the like, the treatment analysis, and the measurement are all carried out in a clean room. The clean room preferably satisfies the 14644-1 clean room standard. The clean room preferably satisfies any one of ISO (International Organization for Standardization) class 1, ISO class 2, ISO class 3, or ISO class 4, more preferably ISO class 1 or ISO class 2, and still more preferably ISO class 1.

Dilution Step

The treatment liquid may be used as a treatment liquid subjected to dilution (diluted treatment liquid) after undergoing a dilution step of diluting the treatment liquid with a diluent.

The diluted treatment liquid is also a form of the treatment liquid according to the embodiment of the present invention as long as the requirements of the present invention are satisfied.

Examples of the diluting fluid include water and an aqueous solution containing isopropanolamine (1-amino-2-propanol) or ammonia.

It is preferable to carry out a purification treatment on the diluting fluid used in the dilution step in advance. In addition, it is more preferable to carry out a purification treatment on the diluted treatment liquid obtained in the dilution step.

Examples of the purification treatment include an ion component reduction treatment using an ion exchange resin, an RO membrane, or the like and removal of foreign substances using filtering, which have been described as the purification treatment for the treatment liquid, and it is preferable to carry out any of these treatments.

The dilution rate of the treatment liquid in the dilution step may be appropriately adjusted according to the type and content of each component, and the target and purpose of use of the treatment liquid. The proportion (dilution factor) of the diluted treatment liquid to the treatment liquid before dilution is preferably 1.5 to 10,000 times, more preferably 2 to 2,000 times, and still more preferably 50 to 1,000 times in terms of mass ratio or volume ratio (volume ratio at 23° C.).

In addition, a treatment liquid (diluted treatment liquid) containing each component in an amount obtained by dividing a suitable content of each component (excluding water) that can be contained in the treatment liquid by a dilution factor (for example, 100) in the above range can also be suitably put into practical use.

In other words, the suitable content of each component (excluding water) with respect to the total mass of the diluted treatment liquid is, for example, an amount obtained by dividing an amount described as the suitable content of each component with respect to the total mass of the treatment liquid (treatment liquid before dilution) by a dilution factor (for example, 100) in the above range.

The change in pH before and after dilution (difference between the pH of the treatment liquid before dilution and the pH of the diluted treatment liquid) is preferably 2.0 or less, more preferably 1.8 or less, and still more preferably 1.5 or less.

The pH of the treatment liquid before dilution and the pH of the diluted treatment liquid are each preferably the above-mentioned suitable aspect.

The specific method of the dilution step of diluting the treatment liquid may be carried out according to the above-mentioned liquid preparation step of the treatment liquid. The stirring device and stirring method used in the dilution step may also be carried out using the known stirring device mentioned in the above-mentioned liquid preparation step of the treatment liquid.

Application of Treatment Liquid

The application of the treatment liquid according to the embodiment of the present invention is not particularly limited, and the treatment liquid according to the embodiment of the present invention can be suitably used in the step of removing a specific member from a semiconductor substrate. Above all, the treatment liquid according to the embodiment of the present invention is preferably used as a residue removing liquid after etching, a resist stripping agent, a cleaning liquid after chemical mechanical polishing (CMP), or an etchant.

As described above, in a case of using the treatment liquid, a diluted treatment liquid obtained by diluting the treatment liquid may be used.

Object to be Treated

Examples of the object to be treated to which the treatment liquid according to the embodiment of the present invention can be suitably used include a semiconductor substrate which has a metal-containing substance on the semiconductor substrate.

The term "on the semiconductor substrate" includes, for example, any of front and back surfaces, side surfaces, insides of grooves, and the like of the semiconductor substrate.

In addition, the metal-containing substance on the semiconductor substrate includes not only the case where the metal-containing substance is present directly on the surface of the semiconductor substrate but also the case where the metal-containing substance is present on the semiconductor substrate through another layer.

In addition, the semiconductor substrate may simultaneously have a plurality of aspects of the metal-containing substance as described above. That is, the semiconductor substrate may have a plurality of types of metal-containing substances.

Examples of the metal contained in the metal-containing substance include at least one metal M selected from the group consisting of Al (aluminum), Ti (titanium), Cr (chromium), Mn (manganese), Co (cobalt), Ni (nickel), Cu (copper), Zr (zirconium), Mo (molybdenum), Ru (ruthenium), La (lanthanum), Hf (hafnium), Ta (tantalum), W (tungsten), Os (osmium), Pt (platinum), and Ir (iridium).

The metal-containing substance may be a substance containing a metal (metal atom), examples of which include an elemental substance of the metal M, an alloy containing the metal M, an oxide of the metal M, a nitride of the metal M, and an oxynitride of the metal M.

In addition, the metal-containing substance may be a mixture containing two or more of these elemental substances or compounds.

The oxide, the nitride, and the oxynitride may be a composite oxide containing a metal, a composite nitride containing a metal, and a composite oxynitride containing a metal, respectively.

The content of the metal atom in the metal-containing substance is preferably 10% by mass or more, more preferably 30% by mass or more, and still more preferably 50% by mass or more with respect to the total mass of the metal-containing substance. The upper limit of the content of the metal atom is 100% by mass because the metal-containing substance may be the metal itself.

The semiconductor substrate preferably has a metal-containing substance containing at least one metal selected from the group consisting of Al, Ti, Co, Cu, Mo, Ta, and W, more preferably a metal-containing substance containing at least one metal selected from the group consisting of Ti, Co, Ta, and W, and still more preferably a metal-containing substance containing at least one metal selected from the group consisting of Ti, Co, and W.

The semiconductor substrate of the object to be treated is not particularly limited, and examples thereof include a substrate having a metal wiring film, a barrier film, and an insulating film on the surface of a wafer constituting the semiconductor substrate.

Examples of the wafer constituting the semiconductor substrate include a wafer consisting of a silicon-based material such as a silicon (Si) wafer, a silicon carbide (SiC) wafer, or a resin-based wafer containing silicon (glass epoxy wafer), a gallium phosphorus (GaP) wafer, a gallium arsenic (GaAs) wafer, and an indium phosphorus (InP) wafer.

Examples of the silicon wafer include an n-type silicon wafer in which a silicon wafer is doped with a pentavalent atom (for example, phosphorus (P), arsenic (As), or antimony (Sb)), and a p-type silicon wafer in which a silicon wafer is doped with a trivalent atom (for example, boron (B) or gallium (Ga)). Examples of silicon for the silicon wafer include amorphous silicon, monocrystalline silicon, polycrystalline silicon, and polysilicon.

Above all, a wafer consisting of a silicon-based material such as a silicon wafer, a silicon carbide wafer, or a resin-based wafer containing silicon (glass epoxy wafer) is preferable.

The semiconductor substrate may have an insulating film on the wafer.

Examples of the insulating film include a silicon oxide film (for example, a silicon dioxide ($SiO_2$) film or a tetraethyl orthosilicate ($Si(OC_2H_5)_4$) film (TEOS film), a silicon nitride film (for example, a silicon nitride ($Si_3N_4$) film or a silicon nitride carbide (SiNC) film), and a low dielectric constant (Low-k) film (for example, a carbon-doped silicon oxide (SiOC) film or a silicon carbide (SiC) film), among which a low dielectric constant (Low-k) film is preferable.

The metal-containing substance is also preferably a metal film containing a metal.

The metal film contained in the semiconductor substrate is preferably a metal film containing a metal M, more preferably a metal film containing at least one metal selected from the group consisting of Al, Ti, Co, Cu, Mo, Ru, Ta, and W, still more preferably a metal film containing at least one metal selected from the group consisting of Al, Ti, Co, Cu, Ru, Ta, and W, particularly preferably a metal film containing at least one metal selected from the group consisting of Ti, Co, Cu, Ru, and W, and most preferably a metal film containing Ti or a metal film containing W.

Examples of the metal film containing at least one metal selected from the group consisting of Ti, Co, Cu, Ru, and W include a film containing titanium as a main component (Ti-containing film), a film containing cobalt as a main component (Co-containing film), a film containing copper as a main component (Cu-containing film), a film containing ruthenium as a main component (Ru-containing film), and a film containing tungsten as a main component (W-containing film).

Examples of the titanium-containing film (metal film containing titanium as a main component) include a metal film consisting of only metal Ti (titanium metal film) and a metal film made of an alloy consisting of metal titanium and another metal (titanium alloy metal film).

Examples of the titanium alloy metal film include a metal film made of an alloy consisting of titanium and one or more metals selected from Al (aluminum), Si (silicon), Cr (chromium), Cu (copper), Mo (molybdenum), and tungsten (W). More specific examples of the titanium alloy metal film include a titanium-aluminum alloy metal film (TiAl alloy metal film), a titanium-silicon alloy metal film (TiSi alloy metal film), a titanium-chromium alloy metal film (TiCr alloy metal film), a titanium-copper alloy metal film (TiCu alloy metal film), a titanium-molybdenum alloy metal film (TiMo alloy metal film), and a titanium-tungsten alloy metal film (TiW alloy metal film).

Examples of the cobalt-containing film (metal film containing cobalt as a main component) include a metal film consisting of only metal cobalt (cobalt metal film) and a metal film made of an alloy consisting of metal cobalt and another metal (cobalt alloy metal film).

Examples of the cobalt alloy metal film include a metal film made of an alloy consisting of cobalt and one or more metals selected from titanium (Ti), chromium (Cr), iron (Fe), nickel (Ni), molybdenum (Mo), palladium (Pd), tantalum (Ta), and tungsten (W). More specific examples of the cobalt alloy metal film include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

It is also preferable that the semiconductor substrate has a copper-containing film (metal film containing copper as a main component).

Examples of the copper-containing film include a wiring film consisting of only metal copper (copper wiring film) and a wiring film made of an alloy consisting of metal copper and another metal (copper alloy wiring film).

Examples of the copper alloy wiring film include a wiring film made of an alloy consisting of copper and one or more metals selected from aluminum (Al), titanium (Ti), chromium (Cr), manganese (Mn), tantalum (Ta), and tungsten (W). More specific examples of the copper alloy wiring film include a copper-aluminum alloy wiring film (CuAl alloy wiring film), a copper-titanium alloy wiring film (CuTi alloy wiring film), a copper-chromium alloy wiring film (CuCr alloy wiring film), a copper-manganese alloy wiring film (CuMn alloy wiring film), a copper-tantalum alloy wiring film (CuTa alloy wiring film), and a copper-tungsten alloy wiring film (CuW alloy wiring film).

Examples of the ruthenium-containing film include a metal film consisting of only metal ruthenium (ruthenium metal film) and a metal film made of an alloy consisting of metal ruthenium and another metal (ruthenium alloy metal film). The ruthenium-containing film is often used as a barrier metal.

Examples of the tungsten-containing film (metal film containing tungsten as a main component) include a metal film consisting of only tungsten (tungsten metal film) and a metal film made of an alloy consisting of tungsten and another metal (tungsten alloy metal film).

Examples of the tungsten alloy metal film include a tungsten-titanium alloy metal film (WTi alloy metal film) and a tungsten-cobalt alloy metal film (WCo alloy metal film).

The tungsten-containing film is used, for example, at a connection between a barrier metal or via and a wiring line.

The metal-containing substance is also preferably a metal compound film containing a compound containing a metal.

Examples of the metal compound film include a titanium nitride film (TiN film) and a tantalum nitride film (TaN).

The metal compound film is used, for example, as a barrier film.

Among the above-mentioned objects to be treated, an object to be treated containing a titanium nitride film and a tungsten metal film or a tungsten alloy metal film is preferable.

Manufacturing Method of Object to be Treated

The method for forming the above-mentioned insulating film, titanium-containing film, cobalt-containing film, copper-containing film, ruthenium-containing film, tungsten-containing film, metal compound film, and the like on a wafer constituting a semiconductor substrate is not particularly limited as long as it is a method commonly carried out in this field.

Examples of the method for forming an insulating film include a method of heat-treating a wafer constituting a semiconductor substrate in the presence of oxygen gas to form a silicon oxide film, and then inflowing silane and ammonia gas to form a silicon nitride film by chemical vapor deposition (CVD).

Examples of the method for forming a titanium-containing film, a cobalt-containing film, a copper-containing film, a ruthenium-containing film, a tungsten-containing film, and a metal compound film include a method of forming a circuit on a wafer having the above-mentioned insulating film by a known method such as resist, and then forming a titanium-containing film, a cobalt-containing film, a copper-containing film, a ruthenium-containing film, a tungsten-containing film, and a metal compound film by a method such as plating, sputtering, CVD, molecular beam epitaxy (MBE), or atomic layer deposition (ALD).

In addition, the object to be treated may be one obtained by subjecting a substrate manufactured by the above method to a predetermined treatment. Examples of the predetermined treatment include an etching treatment, a CMP treatment, and a resist pattern forming treatment.

Method of Using Treatment Liquid

Examples of the method of using the treatment liquid include a method of bringing an object to be treated into contact with the treatment liquid. Hereinafter, a step including the method of bringing the object to be treated into contact with the treatment liquid is also referred to as a "contacting step".

In a case where the contacting step is carried out and then in a case where the W metal film is contained in the object to be treated, the W metal film is not dissolved and the desired treatment (removal of residues, cleaning, or the like) can be carried out. In addition, metals having chemical properties similar to W are not dissolved by the treatment liquid according to the embodiment of the present invention like W. That is, the treatment liquid according to the embodiment of the present invention has anticorrosion properties against these metals. Examples of the metal that the treatment liquid according to the embodiment of the present invention can exhibit anticorrosion properties include V, Cr, Nb, Mo, and Ta.

In a case where the contacting step is carried out and then in a case where the object to be treated contains TiN, the TiN is dissolved. In addition, materials having chemical properties similar to TiN are dissolved by the treatment liquid according to the embodiment of the present invention like TiN. That is, the treatment liquid according to the embodiment of the present invention has a dissolving ability for those materials. Examples of the material that the treatment liquid according to the embodiment of the present invention can exhibit a dissolving ability include Al, Ti, Zr, Hf, Ru, and oxides or nitrides thereof.

In a case where the contacting step is carried out and then in a case where the object to be treated contains W and TiN, TiN is selectively dissolved with respect to W. In addition, the material that the treatment liquid according to the embodiment of the present invention can exhibit a dissolving ability can be selectively dissolved with respect to the metal that the treatment liquid according to the embodiment of the present invention can exhibit anticorrosion properties. Therefore, the treatment liquid according to the embodiment of the present invention can be suitably used as an etchant that selectively dissolves TiN or the like with respect to W or the like.

The object to be treated is as described above.

The method of bringing the object to be treated into contact with the treatment liquid is not particularly limited, and examples thereof include a method of immersing an object to be treated in a treatment liquid placed in a tank, a method of spraying a treatment liquid on an object to be treated, a method of flowing a treatment liquid on an object to be treated, and a combination thereof. The above method may be appropriately selected according to the purpose.

In addition, the above method may appropriately adopt a method commonly carried out in this field. For example, the above method may be scrub cleaning in which a cleaning member such as a brush is physically brought into contact with the surface of an object to be treated to remove residues or the like while supplying a treatment liquid, or spinning (dropwise addition) that adds dropwise a treatment liquid while rotating an object to be treated.

In the immersion type, it is preferable to carry out an ultrasonic treatment on the object to be treated immersed in the treatment liquid, from the viewpoint that impurities remaining on the surface of the object to be treated can be further reduced.

The contact between the object to be treated and the treatment liquid in the contacting step may be carried out only once or may be carried out two or more times. In a case where the contact between the object to be treated and the treatment liquid is carried out two or more times, the same method may be repeated or different methods may be combined.

As the method of the contacting step, either a single wafer type or a batchwise type may be used.

The single wafer type is generally a method of treating an object to be treated one by one, and the batchwise type is generally a method of treating a plurality of objects to be treated at the same time.

The temperature of the treatment liquid is not particularly limited as long as it is a temperature commonly carried out in this field. Generally, cleaning is carried out at room temperature (about 25° C.), but the temperature can be freely selected in order to improve the cleaning efficiency and suppress the damage to the member. For example, the temperature of the treatment liquid is preferably 10° C. to 60° C. and more preferably 15° C. to 50° C.

The pH of the treatment liquid is 7.0 or less, and is preferably a suitable aspect of the pH of the treatment liquid described above. The pH of the treatment liquid subjected to dilution is also preferably a suitable aspect of the pH of the treatment liquid described above.

The contact time between the object to be treated and the treatment liquid can be appropriately changed according to the type and content of each component contained in the treatment liquid, and the target and purpose of use of the treatment liquid. Practically, the contact time is preferably 10 to 120 seconds, more preferably 20 to 90 seconds, and still more preferably 30 to 60 seconds.

The supply amount (supply rate) of the treatment liquid is preferably 50 to 5,000 mL/min and more preferably 500 to 2,000 mL/min.

In the contacting step, a mechanical stirring method may be used in order to further enhance the cleaning ability of the treatment liquid.

Examples of the mechanical stirring method include a method of circulating a treatment liquid on an object to be treated, a method of flowing or spraying a treatment liquid on an object to be treated, and a method of stirring a treatment liquid by ultrasonic waves or megasonic.

In addition, a step of rinsing and cleaning the object to be treated with a solvent (hereinafter, also referred to as "rinsing step") may be carried out after the contacting step.

The rinsing step is carried out continuously after the contacting step, and is preferably a rinsing step using a rinsing solvent (rinsing liquid) for 5 to 300 seconds. The rinsing step may be carried out by using the above-mentioned mechanical stirring method.

Examples of the rinsing solvent include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. In addition, an aqueous rinsing liquid having a pH of more than 8.0 (diluted aqueous ammonium hydroxide or the like) may be used.

The above-mentioned method of bringing the treatment liquid into contact with the object to be treated can be similarly applied as a method of bringing the rinsing solvent into contact with the object to be treated.

In addition, a drying step of drying the object to be treated may be carried out after the rinsing step.

Examples of the drying method include a spin drying method, a method of flowing a dry gas over an object to be treated, a method of heating a substrate by a heating unit such as a hot plate or an infrared lamp, a Marangoni drying method, a Rotagoni drying method, an isopropyl alcohol (IPA) drying method, and any combination of these methods.

EXAMPLES

Hereinafter, the present invention will be described in more detail with reference to Examples.

The materials, amounts used, proportions, treatment details, and treatment procedure, and the like shown in the following Examples can be appropriately changed without departing from the spirit and scope of the present invention. Accordingly, the scope of the present invention should not be construed as being limited to the Examples described below.

In the following examples, the pH of the treatment liquid was measured at 25° C. using a pH meter (model "F-74", manufactured by Horiba, Ltd.) in accordance with JIS Z8802-1984.

In addition, in the manufacture of the treatment liquids of Examples and Comparative Examples, the handling of the container, and the preparation, filling, storage and analysis measurement of the treatment liquid were all carried out in a clean room at a level satisfying ISO class 2 or lower.

Preparation of Treatment Liquid

Each component shown below was mixed to prepare the treatment liquid used for each Example and each Comparative Example. The content of each component in the treatment liquid was as shown in Tables 1-1 to 1-5 shown in the latter part. The content in each table indicates the content of the component excluding the solvent in a case where the following component is a mixture of the solvent and the component.

As the various components used in the Examples, those classified into a semiconductor grade or those classified into a high-purity grade equivalent to the semiconductor grade were used.

Water
Ultrapure water
Cationic Compound
C1 to C13 shown below were used as the cationic compound. The compound indicating a repeating unit represents a compound consisting of the repeating unit.

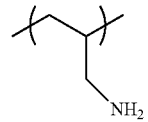

C1

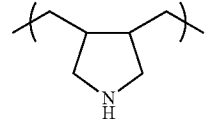

C2

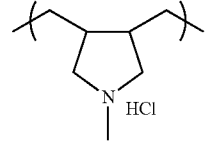

C3

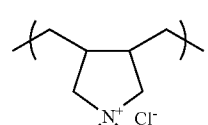

C4

-continued

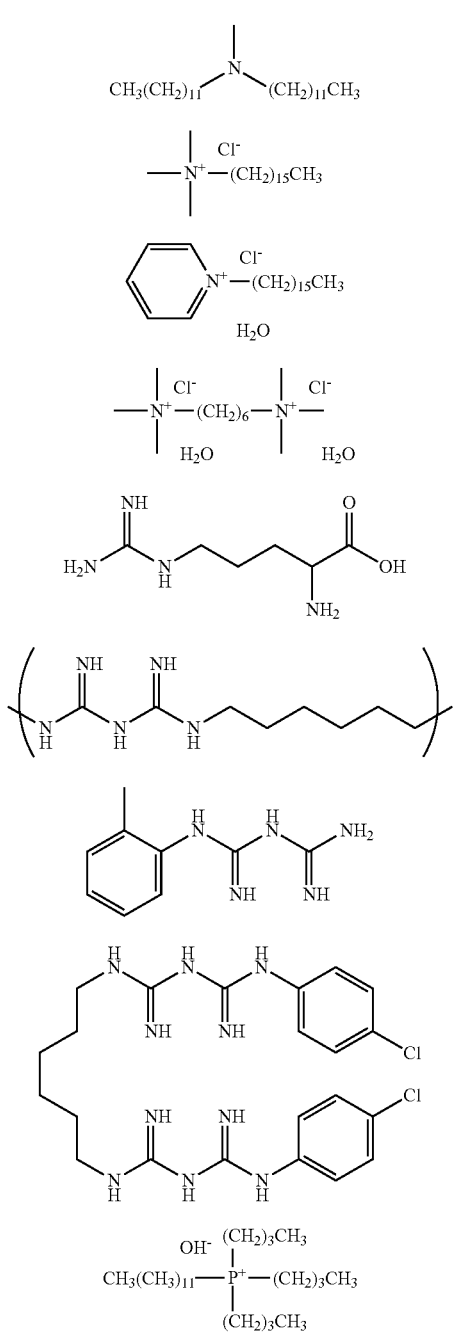

Anionic Compound
A1: a compound consisting of the following repeating units

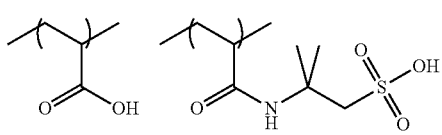

A5: poly(vinyl phosphorous acid) (weight-average molecular weight: 10,000, manufactured by FUJIFILM Wako Pure Chemical Corporation)

A6: polymaleic acid (weight-average molecular weight: 2,000, trade name "NONPOL PWA-50W", manufactured by NOF Corporation)

A7: polyacrylic acid (weight-average molecular weight: 2,000, manufactured by FUJIFILM Wako Pure Chemical Corporation)

A8: polyacrylic acid (weight-average molecular weight: 8,000, manufactured by FUJIFILM Wako Pure Chemical Corporation)

A9: acrylic acid-maleic acid copolymer (weight-average molecular weight: 10,000, trade name "AQUALIC TL37", manufactured by Nippon Shokubai Co., Ltd.)

A10: polyacrylic acid (weight-average molecular weight: 50,000, manufactured by FUJIFILM Wako Pure Chemical Corporation)

A11: poly(styrenesulfonic acid) (weight-average molecular weight: 75,000, manufactured by FUJIFILM Wako Pure Chemical Corporation)

A12: polyacrylic acid (weight-average molecular weight: 100,000, manufactured by FUJIFILM Wako Pure Chemical Corporation)

A13: polyacrylic acid (weight-average molecular weight: 125,000, manufactured by FUJIFILM Wako Pure Chemical Corporation)

Low Molecular Weight Anionic Compound

In Comparative Examples 5 to 7, the following compounds (low molecular weight anionic compounds) were used instead of the above anionic compounds.

A2: a compound shown below

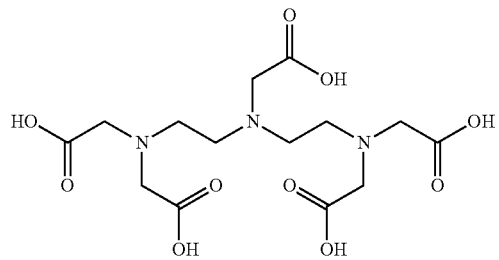 [SMILES: O=C(O)CN(CCN(CC(=O)O)CC(=O)O)CCN(CC(=O)O)CC(=O)O]

A3: a compound shown below

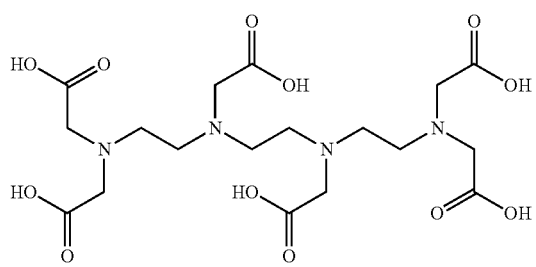 [SMILES: O=C(O)CN(CCN(CCN(CC(=O)O)CC(=O)O)CC(=O)O)CCN(CC(=O)O)CC(=O)O]

A4: a compound shown below

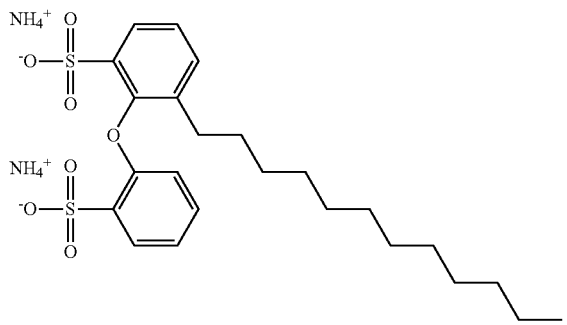

Fluoride Source
  E1: hydrofluoric acid (hydrogen fluoride (HF) aqueous solution)
  E2: hexafluorozirconic acid ($H_2ZrF_6$) aqueous solution
  E3: hexafluorotitanic acid ($H_2TiF_6$) aqueous solution
  E4: hexafluorophosphoric acid ($HPF_6$) aqueous solution
  E5: tetrafluoroboric acid ($HBF_4$) aqueous solution
  E6: hexafluorosilicic acid ($H_2SiF_6$) aqueous solution
Oxidizing Agent
  O1: periodic acid ($H_5IO_6$) aqueous solution
  O2: hydrogen peroxide water
  O3: nitric acid
  O4: peracetic acid
  O5: perchloric acid
  O6: ammonium peroxodisulfate
  O7: trichloroisocyanuric acid
  O8: Ammonium iodate
Corrosion Inhibitor
  I1: tetramethylammonium silicate
  I2: tetraethylammonium silicate
  I3: sodium silicate ($Na_2SiO_3$)
  I4: boric acid ($H_3BO_3$)
Organic Solvent
  S1: ethylene glycol
  S2: dimethyl sulfoxide
  S3: N,N-dimethylformamide
  S4: glycerol
  S5: sulfolane
pH Adjuster
  R1: methanesulfonic acid
  R2: sodium hydroxide
Evaluation
TiN Dissolution Rate A substrate with a TiN layer in which a 30 nm titanium nitride (TiN) layer was formed on one surface of a commercially available silicon wafer (diameter: 12 inches) by CVD was prepared.

The obtained substrate with a TiN layer was placed in a container filled with a treatment liquid of each Example or each Comparative Example, and the treatment liquid was stirred to carry out a treatment for removing the TiN layer for 3 minutes. The temperature of the treatment liquid was 40° C.

The dissolution rate of TiN was calculated by comparing the thickness of the TiN layer measured using a spectroscopic ellipsometer ("VASE" manufactured by J.A. Woollam Japan Corporation) before and after the above treatment. The dissolution rates of TiN in each Example and each Comparative Example are shown in Tables 1-1 to 1-5.

In addition, the dissolution rate of TiN was evaluated according to the following evaluation standards. The evaluation results are shown in Tables 1-1 to 1-5. For practical purposes, an evaluation of D or higher is preferable.

Evaluation Standards for TiN Dissolution Rate
  A: The dissolution rate of TiN is 80 Å/min or more.
  B: The dissolution rate of TiN is 50 Å/min or more and less than 80 Å/min.
  C: The dissolution rate of TiN is 30 Å/min or more and less than 50 Å/min.
  D: The dissolution rate of TiN is 10 Å/min or more and less than 30 Å/min.
  E: The dissolution rate of TiN is less than 10 Å/min.
W Dissolution Rate A substrate with a W layer in which a 30 nm tungsten (W) layer was formed on one surface of a commercially available silicon wafer (diameter: 12 inches) by CVD was prepared.

The obtained substrate with a W layer was placed in a container filled with a treatment liquid of each Example or each Comparative Example, and the treatment liquid was stirred to carry out a treatment for removing the W layer for 3 minutes. The temperature of the treatment liquid was 40° C.

The dissolution rate of W was calculated in the same manner as in the dissolution rate of TiN. The dissolution rates of W in each Example and each Comparative Example are shown in Tables 1-1 to 1-5.

Dissolution rate ratio Using the dissolution rate of W and the dissolution rate of TiN obtained by the above method, the ratio of the dissolution rate of TiN to the dissolution rate of W (dissolution rate ratio) was calculated. The dissolution rate ratios in each Example and each Comparative Example are shown in Tables 1-1 to 1-5.

In addition, the dissolution rate ratio was evaluated according to the following evaluation standards. The evaluation results are shown in Tables 1-1 to 1-5. For practical purposes, an evaluation of D or higher is preferable.

Evaluation Standards for Dissolution Rate Ratio
  AA: The ratio of the dissolution rate of TiN to the dissolution rate of W is 100 or more.
  A: The ratio of the dissolution rate of TiN to the dissolution rate of W is 60 or more and less than 100.
  B: The ratio of the dissolution rate of TiN to the dissolution rate of W is 30 or more and less than 60.
  C: The ratio of the dissolution rate of TiN to the dissolution rate of W is 10 or more and less than 30.
  D: The ratio of the dissolution rate of TiN to the dissolution rate of W is 1 or more and less than 10.
  E: The ratio of the dissolution rate of TiN to the dissolution rate of W is less than 1.
Results Tables 1-1 to 1-5 show the components of the treatment liquids used in each Example and each Comparative Example, and the evaluation results of each Example and each Comparative Example.

In each table, the notation of "Remainder" in the column of "Water" represents that the component other than each component in the treatment liquid is water. In a case where the component is an aqueous solution, the water contained in the component is the remainder.

In each table, the column of "C/A" represents the ratio of the content of the cationic compound to the content of the anionic compound.

In each table, the notation of "2 to 3" in the column of "pH" represents that the pH of the treatment liquid was 2.0 to 3.0.

TABLE 1-1

| Example | Water | Cationic compound Compound 1 % | Cationic compound Compound 2 % | Anionic compound Compound 1 % | Anionic compound Compound 2 % | Low molecular weight anionic compound % | C/A Ratio | Fluoride source Compound 1 % | Oxidizing agent Compound 2 % |
|---|---|---|---|---|---|---|---|---|---|
| 1 | Remainder | C1 0.05 | — | A1 0.01 | — | — | 5.0 | E1 0.24 | O1 0.01 |
| 2 | Remainder | C2 0.05 | — | A1 0.01 | — | — | 5.0 | E1 0.24 | O1 0.01 |
| 3 | Remainder | C3 0.05 | — | A1 0.01 | — | — | 5.0 | E1 0.24 | O1 0.01 |
| 4 | Remainder | C4 0.05 | — | A1 0.01 | — | — | 5.0 | E1 0.24 | O1 0.01 |
| 5 | Remainder | C5 0.05 | — | A1 0.01 | — | — | 5.0 | E1 0.24 | O1 0.01 |
| 6 | Remainder | C6 0.05 | — | A1 0.01 | — | — | 5.0 | E1 0.24 | O1 0.01 |
| 7 | Remainder | C7 0.05 | — | A1 0.01 | — | — | 5.0 | E1 0.24 | O1 0.01 |
| 8 | Remainder | C8 0.05 | — | A1 0.01 | — | — | 5.0 | E1 0.24 | O1 0.01 |
| 9 | Remainder | C9 0.05 | — | A1 0.01 | — | — | 5.0 | E1 0.24 | O1 0.01 |
| 10 | Remainder | C10 0.05 | — | A1 0.01 | — | — | 5.0 | E1 0.24 | O1 0.01 |
| 11 | Remainder | C11 0.05 | — | A1 0.01 | — | — | 5.0 | E1 0.24 | O1 0.01 |
| 12 | Remainder | C12 0.05 | — | A1 0.01 | — | — | 5.0 | E1 0.24 | O1 0.01 |
| 13 | Remainder | C13 0.05 | — | A1 0.01 | — | — | 5.0 | E1 0.24 | O1 0.01 |
| 14 | Remainder | C12 0.05 | — | A5 0.01 | — | — | 5.0 | E1 0.24 | O1 0.01 |
| 15 | Remainder | C12 0.05 | — | A6 0.01 | — | — | 5.0 | E1 0.24 | O1 0.01 |

| Example | Corrosion inhibitor Compound 1 % | Corrosion inhibitor Compound 2 % | Organic solvent Compound % | pH adjuster Compound % | pH | Dissolution rate [Å/min] TiN | Dissolution rate [Å/min] W | Rate ratio TiN/W | TiN ER | TiN/W dissolution rate ratio |
|---|---|---|---|---|---|---|---|---|---|---|
| 1 | I1 0.24 | — | S1 10.0 | R1 1.0 | 2~3 | 39.1 | 4.6 | 8.5 | C | D |
| 2 | I1 0.24 | — | S1 10.0 | R1 1.0 | 2~3 | 12.0 | 2.9 | 4.1 | D | D |
| 3 | I1 0.24 | — | S1 10.0 | R1 1.0 | 2~3 | 30.1 | 8.0 | 3.8 | C | D |
| 4 | I1 0.24 | — | S1 10.0 | R1 1.0 | 2~3 | 30.1 | 7.0 | 4.3 | C | D |
| 5 | I1 0.24 | — | S1 10.0 | R1 1.0 | 2~3 | 74.7 | 23.1 | 3.2 | B | D |
| 6 | I1 0.24 | — | S1 10.0 | R1 1.0 | 2~3 | 37.3 | 10.5 | 3.6 | C | D |
| 7 | I1 0.24 | — | S1 10.0 | R1 1.0 | 2~3 | 20.8 | 3.2 | 6.5 | D | D |
| 8 | I1 0.24 | — | S1 10.0 | R1 1.0 | 2~3 | 77.0 | 25.0 | 3.1 | B | D |
| 9 | I1 0.24 | — | S1 10.0 | R1 1.0 | 2~3 | 72.4 | 21.0 | 3.4 | B | D |
| 10 | I1 0.24 | — | S1 10.0 | R1 1.0 | 2~3 | 32.1 | 0.8 | 40.1 | C | B |
| 11 | I1 0.24 | — | S1 10.0 | R1 1.0 | 2~3 | 76.6 | 1.3 | 58.9 | B | A |
| 12 | I1 0.24 | — | S1 10.0 | R1 1.0 | 2~3 | 81.0 | 0.2 | 405.0 | A | AA |
| 13 | I1 0.24 | — | S1 10.0 | R1 1.0 | 2~3 | 87.1 | 35.0 | 2.5 | A | D |
| 14 | I1 0.24 | — | S1 10.0 | R1 1.0 | 2~3 | 72.4 | 18.6 | 3.9 | B | D |
| 15 | I1 0.24 | — | S1 10.0 | R1 1.0 | 2~3 | 82.1 | 10.1 | 8.1 | A | D |

TABLE 1-2

| Example | Water | Cationic compound Compound 1 % | Cationic compound Compound 2 % | Anionic compound Compound 1 % | Anionic compound Compound 2 % | Low molecular weight anionic compound % | C/A Ratio | Fluoride source Compound 1 % | Oxidizing agent Compound 2 % |
|---|---|---|---|---|---|---|---|---|---|
| 16 | Remainder | C12 0.05 | — | A7 0.01 | — | — | 5.0 | E1 0.24 | O1 0.01 |
| 17 | Remainder | C12 0.05 | — | A8 0.01 | — | — | 5.0 | E1 0.24 | O1 0.01 |
| 18 | Remainder | C12 0.05 | — | A9 0.01 | — | — | 5.0 | E1 0.24 | O1 0.01 |
| 19 | Remainder | C12 0.05 | — | A10 0.01 | — | — | 5.0 | E1 0.24 | O1 0.01 |
| 20 | Remainder | C12 0.05 | — | A11 0.01 | — | — | 5.0 | E1 0.24 | O1 0.01 |
| 21 | Remainder | C12 0.05 | — | A12 0.01 | — | — | 5.0 | E1 0.24 | O1 0.01 |
| 22 | Remainder | C12 0.05 | — | A13 0.01 | — | — | 5.0 | E1 0.24 | O1 0.01 |
| 23 | Remainder | C12 0.009 | — | A1 0.01 | — | — | 0.9 | E1 0.24 | O1 0.01 |
| 24 | Remainder | C12 0.01 | — | A1 0.01 | — | — | 1.0 | E1 0.24 | O1 0.01 |
| 25 | Remainder | C12 0.01 | — | A1 0.005 | — | — | 2.0 | E1 0.24 | O1 0.01 |
| 26 | Remainder | C12 0.20 | — | A1 0.01 | — | — | 20.0 | E1 0.24 | O1 0.01 |
| 27 | Remainder | C12 0.50 | — | A1 0.01 | — | — | 50.0 | E1 0.24 | O1 0.01 |
| 28 | Remainder | C12 1.00 | — | A1 0.01 | — | — | 100.0 | E1 0.24 | O1 0.01 |
| 29 | Remainder | C12 1.10 | — | A1 0.01 | — | — | 110.0 | E1 0.24 | O1 0.01 |
| 30 | Remainder | C12 0.05 | — | A1 0.01 | — | — | 5.0 | E1 0.24 | O1 0.01 |

| Example | Corrosion inhibitor Compound 1 % | Corrosion inhibitor Compound 2 % | Organic solvent Compound % | pH adjuster Compound % | pH | Dissolution rate [Å/min] TiN | Dissolution rate [Å/min] W | Rate ratio TiN/W | Evaluation results TiN ER | Evaluation results TiN/W dissolution rate ratio |
|---|---|---|---|---|---|---|---|---|---|---|
| 16 | I1 0.24 | — | S1 10.0 | R1 1.0 | 2~3 | 81.9 | 6.5 | 12.6 | A | C |
| 17 | I1 0.24 | — | S1 10.0 | R1 1.0 | 2~3 | 83.6 | 5.4 | 15.5 | A | C |
| 18 | I1 0.24 | — | S1 10.0 | R1 1.0 | 2~3 | 82.1 | 4.3 | 19.1 | A | C |
| 19 | I1 0.24 | — | S1 10.0 | R1 1.0 | 2~3 | 81.1 | 2.3 | 35.3 | A | B |
| 20 | I1 0.24 | — | S1 10.0 | R1 1.0 | 2~3 | 80.9 | 2.0 | 40.5 | A | B |
| 21 | I1 0.24 | — | S1 10.0 | R1 1.0 | 2~3 | 82.5 | 2.2 | 37.5 | A | B |
| 22 | I1 0.24 | — | S1 10.0 | R1 1.0 | 2~3 | 81.3 | 1.6 | 50.8 | A | A |
| 23 | I1 0.24 | — | S1 10.0 | R1 1.0 | 2~3 | 80.1 | 43.0 | 1.9 | A | D |
| 24 | I1 0.24 | — | S1 10.0 | R1 1.0 | 2~3 | 79.9 | 11.0 | 7.3 | B | D |
| 25 | I1 0.24 | — | S1 10.0 | R1 1.0 | 2~3 | 78.7 | 2.2 | 35.8 | B | B |
| 26 | I1 0.24 | — | S1 10.0 | R1 1.0 | 2~3 | 78.4 | 1.1 | 71.3 | B | A |
| 27 | I1 0.24 | — | S1 10.0 | R1 1.0 | 2~3 | 65.3 | 1.1 | 59.4 | B | A |
| 28 | I1 0.24 | — | S1 10.0 | R1 1.0 | 2~3 | 14.3 | 0.8 | 17.9 | D | C |
| 29 | I1 0.24 | — | S1 10.0 | R1 1.0 | 2~3 | 10.1 | 1.4 | 7.2 | D | D |
| 30 | I1 0.24 | — | S1 10.0 | R1 2.0 | 1.0 | 73.1 | 11.1 | 6.6 | B | D |

TABLE 1-3

| Example | Water | Cationic compound Compound 1 % | Cationic compound Compound 2 % | Anionic compound Compound 1 % | Anionic compound Compound 2 % | Low molecular weight anionic compound % | C/A Ratio | Fluoride source Compound 1 % | Oxidizing agent Compound 2 % |
|---|---|---|---|---|---|---|---|---|---|
| 31 | Remainder | C12 0.05 | — | A1 0.01 | — | — | 5.0 | E1 0.24 | O1 0.01 |
| 32 | Remainder | C12 0.05 | — | A1 0.01 | — | — | 5.0 | E1 0.24 | O1 0.01 |
| 33 | Remainder | C12 0.05 | — | A1 0.01 | — | — | 5.0 | E1 0.24 | O1 0.01 |
| 34 | Remainder | C12 0.05 | — | A1 0.01 | — | — | 5.0 | — | O1 0.01 |
| 35 | Remainder | C12 0.05 | — | A1 0.01 | — | — | 5.0 | E2 0.24 | O1 0.01 |
| 36 | Remainder | C12 0.05 | — | A1 0.01 | — | — | 5.0 | E3 0.24 | O1 0.01 |
| 37 | Remainder | C12 0.05 | — | A1 0.01 | — | — | 5.0 | E4 0.24 | O1 0.01 |
| 38 | Remainder | C12 0.05 | — | A1 0.01 | — | — | 5.0 | E5 0.24 | O1 0.01 |
| 39 | Remainder | C12 0.05 | — | A1 0.01 | — | — | 5.0 | E6 0.24 | O1 0.01 |
| 40 | Remainder | C12 0.05 | — | A1 0.01 | — | — | 5.0 | E1 0.24 | O2 0.01 |
| 41 | Remainder | C12 0.05 | — | A1 0.01 | — | — | 5.0 | E1 0.24 | O3 0.01 |
| 42 | Remainder | C12 0.05 | — | A1 0.01 | — | — | 5.0 | E1 0.24 | O4 0.01 |
| 43 | Remainder | C12 0.05 | — | A1 0.01 | — | — | 5.0 | E1 0.24 | O5 0.01 |
| 44 | Remainder | C12 0.05 | — | A1 0.01 | — | — | 5.0 | E1 0.24 | O6 0.01 |
| 45 | Remainder | C12 0.05 | — | A1 0.01 | — | — | 5.0 | E1 0.24 | O7 0.01 |

| Example | Corrosion inhibitor Compound 1 % | Corrosion inhibitor Compound 2 % | Organic solvent Compound % | pH adjuster Compound % | pH | Dissolution rate [Å/min] TiN | Dissolution rate [Å/min] W | Rate ratio TiN/W | Evaluation results TiN ER | Evaluation results TiN/W dissolution rate ratio |
|---|---|---|---|---|---|---|---|---|---|---|
| 31 | I1 0.24 | — | S1 10.0 | R2 0.1 | 4.0 | 20.0 | 1.0 | 20.0 | D | C |
| 32 | I1 0.24 | — | S1 10.0 | R2 0.5 | 5.0 | 15.3 | 1.1 | 13.9 | D | C |
| 33 | I1 0.24 | — | S1 10.0 | R2 1.5 | 6.5 | 10.2 | 1.3 | 7.8 | D | D |
| 34 | I1 0.24 | — | S1 10.0 | R1 1.0 | 2~3 | 10.2 | 1.3 | 7.8 | D | D |
| 35 | I1 0.24 | — | S1 10.0 | R1 1.0 | 2~3 | 22.6 | 0.6 | 37.7 | D | B |
| 36 | I1 0.24 | — | S1 10.0 | R1 1.0 | 2~3 | 29.6 | 0.8 | 37.0 | D | B |
| 37 | I1 0.24 | — | S1 10.0 | R1 1.0 | 2~3 | 44.1 | 0.8 | 55.1 | C | A |
| 38 | I1 0.24 | — | S1 10.0 | R1 1.0 | 2~3 | 30.1 | 0.8 | 37.6 | C | B |
| 39 | I1 0.24 | — | S1 10.0 | R1 1.0 | 2~3 | 20.5 | 1.2 | 17.1 | D | C |
| 40 | I1 0.24 | — | S1 10.0 | R1 1.0 | 2~3 | 10.5 | 8.2 | 1.3 | D | D |
| 41 | I1 0.24 | — | S1 10.0 | R1 1.0 | 2~3 | 20.1 | 4.3 | 4.7 | D | D |
| 42 | I1 0.24 | — | S1 10.0 | R1 1.0 | 2~3 | 40.2 | 3.1 | 13.0 | C | C |
| 43 | I1 0.24 | — | S1 10.0 | R1 1.0 | 2~3 | 50.6 | 1.1 | 46.0 | C | B |
| 44 | I1 0.24 | — | S1 10.0 | R1 1.0 | 2~3 | 80.2 | 0.6 | 133.7 | A | AA |
| 45 | I1 0.24 | — | S1 10.0 | R1 1.0 | 2~3 | 80.9 | 0.5 | 161.8 | A | AA |

TABLE 1-4

| Example | Water | Cationic compound Compound 1 % | Cationic compound Compound 2 % | Anionic compound Compound 1 % | Anionic compound Compound 2 % | Low molecular weight anionic compound % | C/A Ratio | Fluoride source Compound 1 % | Oxidizing agent Compound 2 % |
|---|---|---|---|---|---|---|---|---|---|
| 46 | Remainder | C12 0.05 | — | A1 0.01 | — | — | 5.0 | E1 0.24 | O1 0.01 |
| 47 | Remainder | C12 0.05 | — | A1 0.01 | — | — | 5.0 | E1 0.24 | O1 0.01 |
| 48 | Remainder | C12 0.05 | — | A1 0.01 | — | — | 5.0 | E1 0.24 | O1 0.01 |
| 49 | Remainder | C12 0.05 | — | A1 0.01 | — | — | 5.0 | E1 0.24 | O1 0.01 |
| 50 | Remainder | C12 0.05 | — | A1 0.01 | — | — | 5.0 | E1 0.24 | O1 0.01 |
| 51 | Remainder | C12 0.05 | — | A1 0.01 | — | — | 5.0 | E1 0.24 | O1 0.01 |
| 52 | Remainder | C12 0.05 | — | A1 0.01 | — | — | 5.0 | E1 0.24 | O1 0.01 |
| 53 | Remainder | C12 0.05 | — | A1 0.01 | — | — | 5.0 | E1 0.24 | O1 0.01 |
| 54 | Remainder | C12 0.05 | — | A1 0.01 | — | — | 5.0 | E1 0.24 | O1 0.01 |
| 55 | Remainder | C12 0.01 | C6 0.04 | A1 0.01 | — | — | 5.0 | E1 0.24 | O1 0.01 |
| 56 | Remainder | C12 0.025 | C6 0.025 | A1 0.01 | — | — | 5.0 | E1 0.24 | O1 0.01 |
| 57 | Remainder | C12 0.04 | C6 0.01 | A1 0.01 | — | — | 5.0 | E1 0.24 | O1 0.01 |
| 58 | Remainder | C12 0.05 | — | A1 0.002 | A10 0.008 | — | 5.0 | E1 0.24 | O1 0.01 |
| 59 | Remainder | C12 0.05 | — | A1 0.005 | A10 0.005 | — | 5.0 | E1 0.24 | O1 0.01 |
| 60 | Remainder | C12 0.05 | — | A1 0.008 | A10 0.002 | — | 5.0 | E1 0.24 | O1 0.01 |

| Example | Corrosion inhibitor Compound 1 % | Corrosion inhibitor Compound 2 % | Organic solvent Compound % | pH adjuster Compound % | pH | Dissolution rate [Å/min] TiN | Dissolution rate [Å/min] W | Rate ratio TiN/W | Evaluation results TiN ER | Evaluation results TiN/W dissolution rate ratio |
|---|---|---|---|---|---|---|---|---|---|---|
| 46 | — | — | S1 10.0 | R1 0.1 | 2~3 | 81.0 | 2.0 | 40.5 | A | B |
| 47 | I2 0.24 | — | S1 10.0 | R1 1.0 | 2~3 | 60.2 | 0.5 | 120.4 | B | AA |
| 48 | I3 0.24 | — | S1 10.0 | R1 1.0 | 2~3 | 50.6 | 0.2 | 253.0 | C | AA |
| 49 | I4 0.24 | — | S1 10.0 | R1 1.0 | 2~3 | 70.2 | 0.3 | 234.0 | B | AA |
| 50 | I1 0.24 | — | — | R1 1.0 | 2~3 | 78.4 | 1.2 | 65.3 | B | A |
| 51 | I1 0.24 | — | S2 10.0 | R1 1.0 | 2~3 | 80.1 | 1.2 | 66.8 | A | A |
| 52 | I1 0.24 | — | S3 10.0 | R1 1.0 | 2~3 | 80.6 | 0.9 | 89.6 | A | A |
| 53 | I1 0.24 | — | S4 10.0 | R1 1.0 | 2~3 | 80.7 | 0.7 | 115.3 | A | AA |
| 54 | I1 0.24 | — | S5 10.0 | R1 1.0 | 2~3 | 80.1 | 0.5 | 160.2 | A | AA |
| 55 | I1 0.24 | — | S1 10.0 | R1 1.0 | 2~3 | 80.6 | 2.7 | 29.9 | A | C |
| 56 | I1 0.24 | — | S1 10.0 | R1 1.0 | 2~3 | 80.8 | 1.3 | 62.2 | A | A |
| 57 | I1 0.24 | — | S1 10.0 | R1 1.0 | 2~3 | 80.3 | 0.4 | 200.8 | A | AA |
| 58 | I1 0.24 | — | S1 10.0 | R1 1.0 | 2~3 | 80.8 | 1.1 | 73.5 | A | A |
| 59 | I1 0.24 | — | S1 10.0 | R1 1.0 | 2~3 | 80.4 | 0.6 | 134.0 | A | AA |
| 60 | I1 0.24 | — | S1 10.0 | R1 1.0 | 2~3 | 81.3 | 0.3 | 271.0 | A | AA |

TABLE 1-5

| Comparative Example | Water — | Cationic compound Compound 1 % | Cationic compound Compound 2 % | Anionic compound Compound 1 % | Anionic compound Compound 2 % | Low molecular weight anionic compound % | C/A Ratio | Fluoride source Compound 1 % | Oxidizing agent Compound 2 % |
|---|---|---|---|---|---|---|---|---|---|
| 1 | Remainder | C13 0.001 | — | — | — | — | — | E6 0.4 | O8 0.005 |
| 2 | Remainder | C8 0.00025 | — | — | — | — | — | F6 0.8 | O8 0.01 |
| 3 | Remainder | C14 0.004 | — | — | — | — | — | E6 1.2 | O1 0.003 |
| 4 | Remainder | C12 0.05 | — | — | — | — | — | E1 0.24 | O1 0.01 |
| 5 | Remainder | C12 0.05 | — | — | — | A2 0.01 | 5.0 | E1 0.24 | O1 0.01 |
| 6 | Remainder | C12 0.05 | — | — | — | A3 0.01 | 5.0 | E1 0.24 | O1 0.01 |
| 7 | Remainder | C12 0.05 | — | — | — | A4 0.01 | 5.0 | E1 0.24 | O1 0.01 |
| 8 | Remainder | C12 0.05 | — | A1 0.01 | — | — | 5.0 | E1 0.24 | O1 0.01 |

| Comparative Example | Corrosion inhibitor Compound 1 % | Corrosion inhibitor Compound 2 % | Organic solvent Compound % | pH adjuster Compound % | pH — | Dissolution rate [Å/min] TiN | Dissolution rate [Å/min] W | Rate ratio TiN/W | Evaluation results TiN ER | Evaluation results TiN/W dissolution rate ratio |
|---|---|---|---|---|---|---|---|---|---|---|
| 1 | I5 0.03 | — | — | — | 2~3 | 9.6 | 1.2 | 8.0 | E | D |
| 2 | I1 0.2 | I5 0.04 | — | — | 2~3 | 9.2 | 1.4 | 6.6 | E | D |
| 3 | I1 0.3 | — | — | — | 2~3 | 9.5 | 2.1 | 4.5 | E | D |
| 4 | I1 0.24 | — | S1 10.0 | R1 1.0 | 2~3 | 80.2 | 95.0 | 0.8 | A | E |
| 5 | I1 0.24 | — | S1 10.0 | R1 1.0 | 2~3 | 81.7 | 84.5 | 0.97 | A | E |
| 6 | I1 0.24 | — | S1 10.0 | R1 1.0 | 2~3 | 85.1 | 88.6 | 0.96 | A | E |
| 7 | I1 0.24 | — | S1 10.0 | R1 1.0 | 2~3 | 79.3 | 79.9 | 0.99 | B | E |
| 8 | I1 0.24 | — | S1 10.0 | R2 2.0 | 7.1 | 0.1 | >100 | 0.0 | E | E |

From the results in each table, it was confirmed that the treatment liquid according to the embodiment of the present invention exerted a desired effect.

From the comparison between Example 13 and other Examples, it was confirmed that, in a case where the cationic compound contained a compound having a nitrogen atom, the ratio of the dissolution rate of TiN to the dissolution rate of W was large.

From the comparison between Examples 11 and 12 and other Examples, it was confirmed that, in a case where the cationic compound contained a compound having a structure represented by Formula (3-4), the ratio of the dissolution rate of TiN to the dissolution rate of W was large, and the dissolution rate of TiN was excellent.

From the comparison between Example 10 and other Examples, it was confirmed that, in a case where the cationic compound contained a resin having a repeating unit represented by Formula (L), the ratio of the dissolution rate of TiN to the dissolution rate of W was large, and the dissolution rate of TiN was excellent.

From the comparison between Examples 23 and 29 and Examples 24 to 28, it was confirmed that, in a case where the mass ratio of the content of the cationic compound to the content of the anionic compound was 1 to 100, the ratio of the dissolution rate of TiN to the dissolution rate of W was large, and the dissolution rate of TiN was excellent.

From the comparison between Example 34 and other Examples, it was confirmed that, in a case where the treatment liquid further contained a fluoride source, the ratio of the dissolution rate of TiN to the dissolution rate of W was large, and the dissolution rate of TiN was excellent.

From the comparison between Example 46 and other Examples, it was confirmed that, in a case where the treatment liquid further contained a corrosion inhibitor, the ratio of the dissolution rate of TiN to the dissolution rate of W was large.

From the comparison between Example 50 and other Examples, it was confirmed that, in a case where the treatment liquid further contained an organic solvent, the ratio of the dissolution rate of TiN to the dissolution rate of W was large.

Removal of dry etching residue A laminate in which a $SiO_2$ film having a thickness of 100 nm is laminated on a substrate (Si) is prepared. Plasma etching is carried out on the laminate with a gas containing fluorine using a TiN metal hard mask as a mask, and etching of about 50 nm is carried out on the SiO₂ film to prepare a test piece for an evaluation test in which a 2 cm square lattice pattern is formed.

The dry etching residues containing fluorine adhere to the test piece after etching. The dry etching residues containing fluorine can be analyzed by detecting fluorine by X-ray photoelectron spectroscopy (XPS). The content of fluorine atomic weight on the surface of the test piece after etching is 4 to 5 atomic %.

Next, the dry etching residue removal performance of the treatment liquid of each of the foregoing Examples is evaluated by the following procedure.

While stirring the treatment liquid, the test piece is immersed in the treatment liquid having a liquid temperature of 65° C. to clean the test piece until a predetermined cleaning time elapses. After 90 seconds, the test piece is immediately removed from the treatment liquid, rinsed with ion exchange water, and the surface of the test piece is dried with a stream of nitrogen gas.

The composition of the surface of the obtained test piece is analyzed using an XPS device (trade name: Quantera SXM, manufactured by ULVAC-PHI, Inc.) to measure the content (atomic %) of fluorine atoms derived from the dry etching residues on the surface of the test piece.

After cleaning for 90 seconds, the content of fluorine atoms becomes 1 atomic % or less, and therefore the dry etching residues can be sufficiently removed according to the treatment liquid of each of the foregoing Examples.

Removal of Chemical Mechanical Polishing Residues

A pattern having a groove having a line width of 0.18 μm and a depth of 0.5 μm is prepared on the surface of a Si wafer (diameter: 8 inches), and a metal film consisting of W is formed on the surface by vapor deposition. The surface of the wafer on the side having a metal film is polished using FREX 300S-II (polishing device, manufactured by Ebara Corporation). Polishing (CMP treatment) is carried out using CSL9044C and BSL8176C (trade names, both manufactured by FUJIFILM Planar Solutions, LLC) as polishing liquids.

In the CMP treatment for the wafer having a metal film on the surface, the polishing pressure is 2.0 psi and the supply rate of the polishing liquid is 0.28 mL/(minute·cm²). The polishing time is 60 seconds. In addition, "psi" means "pound-force per square inch", and 1 psi=6894.76 Pa.

Thereafter, the CMP-treated wafer is scrub-cleaned for 30 seconds using the treatment liquid of each Example adjusted to room temperature (23° C.), and then dried.

For the dried wafer, the number of detected signal intensities corresponding to defects having a length of 0.1 μm or more is measured on the polished surface of the wafer, using a defect detection device (ComPlus-II, manufactured by AMAT, Inc.).

In a case where the wafer after CMP treatment is scrub-cleaned with the treatment liquid of each Example, the number of defects per wafer on the polished surface of the wafer is less than 300. In addition, W remaining in the groove is not corroded by the CMP treatment.

What is claimed is:

1. A treatment liquid comprising:
   water;
   a cationic compound;
   an anionic compound selected from the group consisting of a resin having a carboxy group or a salt thereof, a resin having a sulfo group or a salt thereof, a resin having a phosphorous acid group or a salt thereof, and a resin having a phosphoric acid group or a salt thereof, and
   an oxidizing agent,
   wherein the cationic compound includes a compound having a structure represented by Formula (3-4),

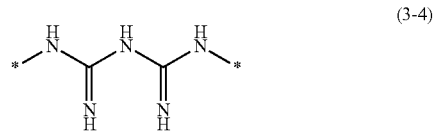 [SMILES: *NC(=N)NC(=N)N*]

in Formula (3-4), * represents a bonding position,
wherein the treatment liquid has a pH of 7.0 or less, and the treatment liquid is substantially free of abrasive grains.

2. The treatment liquid according to claim 1,
wherein the cationic compound includes a compound represented by Formula (H),

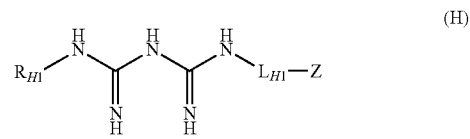

in Formula (H), $R_{H1}$ represents a hydrogen atom or a monovalent substituent,
in Formula (H), $L_{H1}$ represents a single bond or a divalent linking group,
in Formula (H), Z represents an alkyl group which may have a substituent, an aryl group which may have a substituent, or a group represented by Formula (3-5),

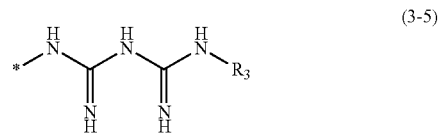

in Formula (3-5), $R_3$ represents a hydrogen atom or a monovalent substituent, and
in Formula (3-5), * represents a bonding position.

3. The treatment liquid according to claim 1,
wherein a mass ratio of a content of the cationic compound to a content of the anionic compound is 1 to 100.

4. The treatment liquid according to claim 1,
wherein the oxidizing agent includes one or more oxidizing agents selected from the group consisting of hydrogen peroxide, nitric acid, cerium nitrate salt, iron nitrate, peracetic acid, periodic acid, periodate, perchloric acid, perchlorate, chloric acid, hypochlorous acid, hypochlorite, persulfuric acid, persulfate, peroxodisulfuric acid, peroxodisulfate, isocyanuric acid, isocyanurate, trichloroisocyanuric acid, and trichloroisocyanurate.

5. The treatment liquid according to claim 1, further comprising:
a fluoride source.

6. The treatment liquid according to claim 5,
wherein the fluoride source includes a compound selected from the group consisting of HF, $H_2SiF_6$, $H_2TiF_6$, $H_2ZrF_6$, $HPF_6$, and $HBF_4$.

7. The treatment liquid according to claim 1, further comprising:
a corrosion inhibitor.

8. The treatment liquid according to claim 1, further comprising:
an organic solvent.

9. The treatment liquid according to claim 1,
wherein the treatment liquid is used as any of a residue removing liquid after etching, a resist stripping agent, a cleaning liquid after chemical mechanical polishing, or an etchant.

10. A treatment liquid comprising:
water;
a cationic compound;
an anionic compound selected from the group consisting of a resin having a carboxy group or a salt thereof, a resin having a sulfo group or a salt thereof, a resin having a phosphorous acid group or a salt thereof, and a resin having a phosphoric acid group or a salt thereof; and
an oxidizing agent,
wherein the cationic compound contains a resin having a repeating unit selected from the group consisting of repeating units represented by Formulae (I) to (L),

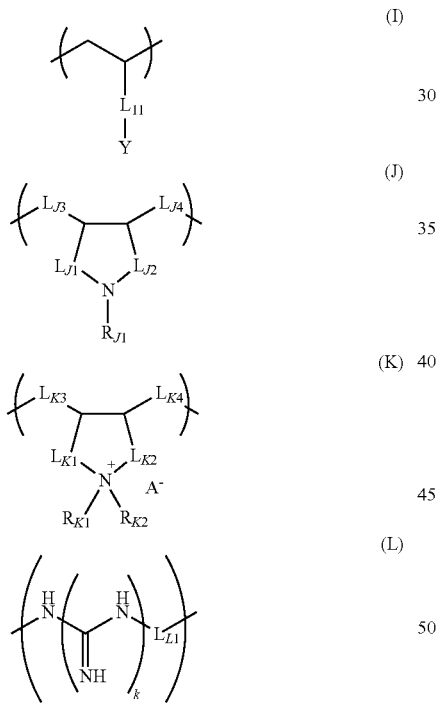

in Formula (I), Ln represents a single bond or a divalent linking group,
in Formula (I), Y represents a group having a structure represented by Formula (1-1), Formula (2-1), Formula (3-1), or Formula (4-2),
in Formula (J), $L_{J1}$ to $L_{J4}$ each independently represent a single bond or a divalent linking group,
in Formula (J), $R_{J1}$ represents a hydrogen atom or a monovalent substituent,
in Formula (K), $L_{K1}$ to $L_{K4}$ each independently represent a single bond or a divalent linking group,
in Formula (K), $R_{K1}$ and $R_{K2}$ each independently represent a hydrogen atom or a monovalent substituent,
in Formula (K), A⁻ represents a monovalent anion,
in Formula (L), $L_{L1}$ represents a single bond or a divalent linking group,
in Formula (L), k represents an integer of 0 to 3,

 (1-1)

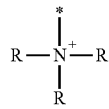 (2-1)

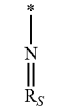 (3-1)

 (4-2)

in Formula (1-1), Formula (2-1), Formula (3-1), and Formula (4-2), * represents a bonding position,
in Formula (1-1), Formula (2-1) and Formula (4-2), R's each independently represent a hydrogen atom or a monovalent substituent, and
in Formula (3-1) and Formula (4-2), $R_S$ represents a divalent substituent,
wherein the treatment liquid has a pH of 7.0 or less, and the treatment liquid is substantially free of abrasive grains.

11. The treatment liquid according to claim 10,
wherein the cationic compound contains the resin having a repeating unit represented by Formula (L).

12. The treatment liquid according to claim 10,
wherein a mass ratio of a content of the cationic compound to a content of the anionic compound is 1 to 100.

13. The treatment liquid according to claim 10,
wherein the oxidizing agent includes one or more oxidizing agents selected from the group consisting of hydrogen peroxide, nitric acid, cerium nitrate salt, iron nitrate, peracetic acid, periodic acid, periodate, perchloric acid, perchlorate, chloric acid, hypochlorous acid, hypochlorite, persulfuric acid, persulfate, peroxodisulfuric acid, peroxodisulfate, isocyanuric acid, isocyanurate, trichloroisocyanuric acid, and trichloroisocyanurate.

14. The treatment liquid according to claim 10, further comprising:
a fluoride source.

15. The treatment liquid according to claim 14,
wherein the fluoride source includes a compound selected from the group consisting of HF, $H_2SiF_6$, $H_2TiF_6$, $H_2ZrF_6$, $HPF_6$, and $HBF_4$.

16. The treatment liquid according to claim 10, further comprising:
a corrosion inhibitor.

17. The treatment liquid according to claim 10, further comprising:
an organic solvent.

18. The treatment liquid according to claim 10, wherein the treatment liquid is used as any of a residue removing liquid after etching, a resist stripping agent, a cleaning liquid after chemical mechanical polishing, or an etchant.

* * * * *